(12) United States Patent
Wu et al.

(10) Patent No.: US 11,696,412 B2
(45) Date of Patent: Jul. 4, 2023

(54) DISPLAY DEVICE AND FORMATION METHOD THEREOF

(71) Applicant: Hubei Yangtze Industrial Innovation Center Of Advanced Display Co., Ltd., Wuhan (CN)

(72) Inventors: Shouzheng Wu, Shanghai (CN); Donghua Chen, Shanghai (CN); Shaorong Yu, Shanghai (CN); Yongxin He, Shanghai (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 51 days.

(21) Appl. No.: 17/182,432

(22) Filed: Feb. 23, 2021

(65) Prior Publication Data
US 2022/0167509 A1  May 26, 2022

(30) Foreign Application Priority Data
Nov. 24, 2020 (CN) .......................... 202011325992.7

(51) Int. Cl.
H05K 5/00 (2006.01)
(52) U.S. Cl.
CPC .................... H05K 5/0017 (2013.01)

(58) Field of Classification Search
USPC .......................... 361/807, 809, 810
See application file for complete search history.

(56) References Cited

U.S. PATENT DOCUMENTS

2019/0346887 A1* 11/2019 Park ..................... G06F 1/1681
2020/0225699 A1* 7/2020 Yu ..................... H04M 1/0216

FOREIGN PATENT DOCUMENTS

| CN | 106875845 A | 6/2017 |
|----|-------------|--------|
| CN | 110473466 A | 11/2019 |

\* cited by examiner

*Primary Examiner* — Hung S. Bui
(74) *Attorney, Agent, or Firm* — Anova Law Group, PLLC

(57) ABSTRACT

A display device and its formation method are provided in the present disclosure. The display device includes a flexible display panel; a bending auxiliary layer fixed on a first surface of the flexible display panel; a support plate at a side of the bending auxiliary layer away from the flexible display panel; and an adhesive layer, between the bending auxiliary layer and the support plate, configured to fix the bending auxiliary layer to the support plate. A region where the bending auxiliary layer overlaps the support plate includes a first region and a second region. A sum of thicknesses of the bending auxiliary layer and the support plate in the first region is less than a sum of thicknesses of the bending auxiliary layer and the support plate in the second region. The adhesive layer is in the first region and not in the second region.

17 Claims, 13 Drawing Sheets

A-A

DISPLAY DEVICE AND FORMATION METHOD THEREOF

CROSS-REFERENCE TO RELATED APPLICATION

This application claims the priority of Chinese Patent Application No. 202011325992.7, filed on Nov. 24, 2020, the content of which is incorporated herein by reference in its entirety.

TECHNICAL FIELD

The present disclosure generally relates to the field of display technology and, more particularly, relates to a display device and its formation method.

BACKGROUND

Recently, display technologies have been developed rapidly, from cathode ray tube (CRT) display, plasma display (PDP), liquid crystal display (LCD) to organic light-emitting diode (OLED) display and micro light-emitting diode (micro-LED) display.

Current display technologies move rapidly for narrow frame, high contrast, high resolution, full color display, low power consumption, high reliability, long lifetime, and thinness and lightness. Moreover, the research of flexible display screen (soft screen) technology also has been continuously developed and deepened.

Different from conventional flat panel display, when a flexible material is used as a substrate of a display panel, the display panel may realize display with flexible/soft screen, thereby creating a desirable visual effect. Due to its bendability, the flexible display panels may be used in various fields, such as rollable display devices, flexible wearable devices, foldable displays, and the like. Therefore, there is a need to provide a foldable display device with reduced creases.

SUMMARY

One aspect of the present disclosure provides a display device. The display device includes a flexible display panel; a bending auxiliary layer, fixed on a first surface of the flexible display panel; a support plate, at a side of the bending auxiliary layer away from the flexible display panel; and an adhesive layer, between the bending auxiliary layer and the support plate, configured to fix the bending auxiliary layer to the support plate. A region where the bending auxiliary layer and the support plate are overlapped with each other includes a first region and a second region. A sum of thicknesses of the bending auxiliary layer and the support plate in the first region is less than a sum of thicknesses of the bending auxiliary layer and the support plate in the second region. The adhesive layer is in the first region and not in the second region.

Another aspect of the present disclosure provides a method for forming a display device. The method includes providing a flexible display panel; providing a bending auxiliary layer, fixed on a first surface of the flexible display panel; providing a support plate, where the bending auxiliary layer is fixed to the support plate through an adhesive layer; and forming recessed-portions by performing a thinning process or a thickening process on the bending auxiliary layer, or performing a thinning process or a thickening process on the support plate; where the adhesive layer is at least filled in the recessed-portions.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
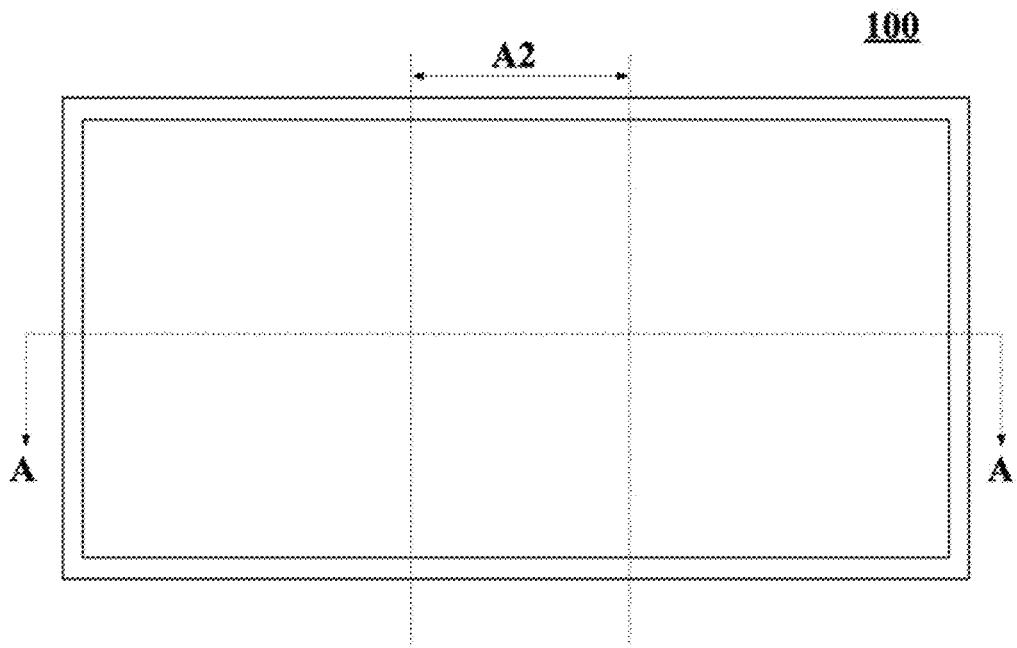
FIG. 1 illustrates a top view of a display device not being bent according to various embodiments of the present disclosure.

Various embodiments of the present disclosure are described in detail with reference to the drawings. It should be noted that the relative arrangement of components and steps, numerical expressions, and numerical values set forth in the embodiments may not limit the scope of the present disclosure unless specifically stated otherwise.

The following description of at least one exemplary embodiment is merely illustrative, which may not limit the present disclosure and its application or use.

Techniques, methods and equipment known to those skilled in the art may not be discussed in detail, but where appropriate, the techniques, methods and equipment should be considered as a part of the specification.

In all exemplary embodiments shown and discussed herein, any specific values should be interpreted as merely exemplary and not limiting. Therefore, other examples of the exemplary embodiments may have different values.

It should be noted that similar reference numerals and letters indicate similar items in the following drawings. Therefore, once an item is defined in one drawing, there is no need to discuss it further in subsequent drawings.

Figure 2:
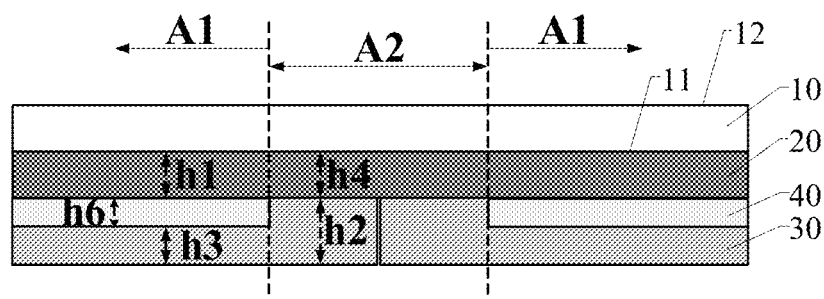
FIG. 2 illustrates a cross-sectional schematic of a display device along an AA line in FIG. 1.
Figure 3:
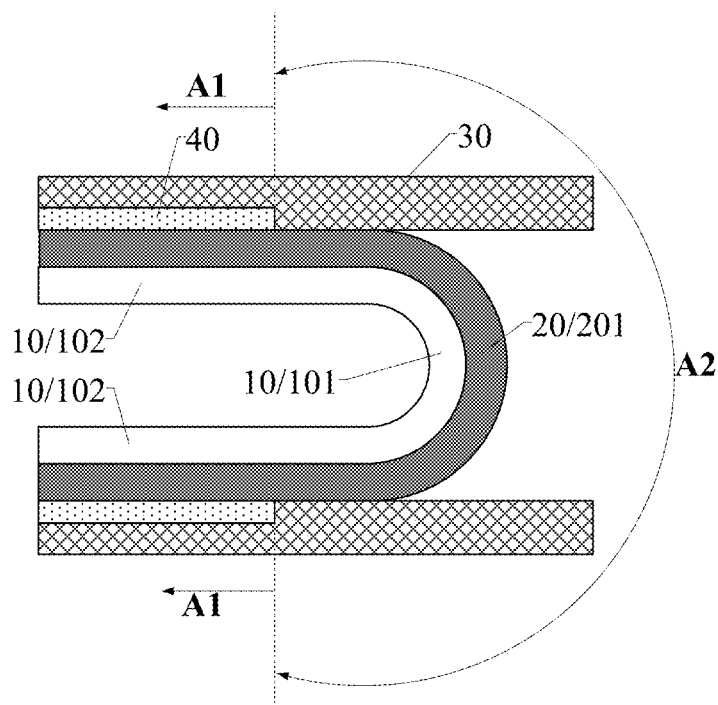
FIG. 3 illustrates a structural schematic of a display device after being bent according to various embodiments of the present disclosure.

FIG. 1 illustrates a top view of a display device not being bent according to various embodiments of the present disclosure; FIG. 2 illustrates a cross-sectional schematic of the display device along an AA line in FIG. 1; and FIG. 3 illustrates a structural schematic of the display device after being bent according to various embodiments of the present disclosure. It should be noted that FIG. 3 is a schematic of the display device in FIG. 2 in a bent state, and the position of the cross-sectional line may refer to the position of the line AA in FIG. 1. Referring to FIGS. 1-3, a display device 100 provided by the present disclosure may include:

a flexible display panel 10;

a bending auxiliary layer 20, fixed on a first surface 11 of the flexible display panel 10;

a support plate 30, located on the side of the bending auxiliary layer 20 away from the flexible display panel 10; and an adhesive layer 40, which is located between the bending auxiliary layer 20 and the support plate 30 and configured to fix the bending auxiliary layer 20 to the support plate 30.

The region where the bending auxiliary layer 20 and the support plate 30 are overlapped with each other may include a first region A1 and a second region A2; and the sum of the thicknesses of the bending auxiliary layer 20 and the support plate 30 in the first region A1 may be less than the sum of the thicknesses of the bending auxiliary layer 20 and the support plate 30 in the second region A2.

The adhesive layer 40 may be located in the first region A1 and not in the second region A2.

It should be noted that a rectangular display device may be taken as an example to exemplarily illustrate the display device 100 of the present disclosure in FIG. 1, and the shape of the display device 100 may not be limited according to various embodiments of the present disclosure. In some other embodiments of the present disclosure, the shape of the display device 100 may also be embodied in a circle, an ellipse, and other shapes other than a rectangle. Furthermore, the relative positional relationship of the flexible display panel 10, the bending auxiliary layer 20, the support plate 30, and the adhesive layer 40 in the display device 100 may only be illustrated in FIG. 2, which may not represent the actual size of each film layer; and the actual film structure of the flexible display panel 10 may not be shown in FIG. 2. In fact, the flexible display panel 10 may include a multi-layer structure, which may be described in subsequent embodiments in the present disclosure.

For example, referring to FIGS. 1-3, in the display device 100 provided by the present disclosure, the bending auxiliary layer 20 and the support plate 30 may be introduced at the side of the first surface 11 of the flexible display panel 10, such that the flexible display panel 10 may be bent while supporting the flexible display panel 10 with the support plate 30. Optionally, the first surface 11 of the flexible display panel 10 may be a surface disposed opposite to a light-exiting surface 12 of the flexible display panel 10, that is, a non-light-exiting surface. The region where the bending auxiliary layer 20 and the support plate 30 are overlapped with each other may include the first region A1 and the second region A2. The sum of the thicknesses of the bending auxiliary layer 20 and the support plate 30 in the first region A1 (corresponding to h1+h3 in FIG. 2) may be less than the sum of the thicknesses of the bending auxiliary layer 20 and the support plate 30 in the second region A2 (corresponding to h4+h2 in FIG. 2); the adhesive layer 40 for fixing the bending auxiliary layer 20 to the support plate 30 may be located in the first region A1 where the sum of the thicknesses of the bending auxiliary layer 20 and the support plate 30 is small; and the adhesive layer 40 may not be disposed in the second region A2, where h1 denotes the thickness of the bending auxiliary layer 20 in the first region A1, h2 denotes the thickness of the support plate 30 in the second region A2, h3 denotes the thickness of the support plate 30 in the first region A1, and h4 denotes the thickness of the bending auxiliary layer 20 in the second region A2. When the display device 100 is bent, that is, in the bent state, referring to FIGS. 2-3, the bending region may be located in the second region A2 where the adhesive layer 40 is not disposed, and the portion of the support plate 30 located in the first region A1 may support the bending auxiliary layer 20 and the flexible display panel 10 in the first region A1. In the unbent state, referring to FIG. 2, the sum of the thicknesses of the bending auxiliary layer 20 and the support plate 30 in the first region A1 is less than the sum of the thicknesses of the bending auxiliary layer 20 and the support plate 30 in the second region A2, such that the spacing between the support plate 30 and the bending auxiliary layer 20 in the second region A2 may be greatly reduced. Therefore, the portion of the support plate 30 located in the second region A2 may provide a flattened support surface for the bending auxiliary layer 20 and the flexible display panel 10 in the unbent state of the display device 100, and a new film structure may not need to be introduced to provide support, which may effectively reduce the possibility of creases in the second region A2 of the display device 100 in the unbent state and may be beneficial for save production costs.

If the surface of the support plate 30 facing toward the adhesive layer 40 is flat, and the surface of the bending auxiliary layer 20 facing toward the adhesive layer 40 is also flat, the thickness of the adhesive layer 40 may be equal to the spacing magnitude between the support plate 30 and the bending auxiliary layer 20 in the second region A2. In order to reduce the influence of the spacing on the supporting function of the support plate 30 on the bending auxiliary layer 30, the thickness of the adhesive layer 40 may be configured to be small, thereby reducing the spacing magnitude between the support plate 30 and the bending auxiliary layer 20 at the second region A2. However, the reduced thickness of the adhesive layer 40 may, on the one hand, increase the process difficulty, and on the other hand adversely affect the adhesive force between the adhesive layer 40 and each of the support plate 30 and the bending auxiliary layer 20. In the present application, the sum of the thicknesses of the bending auxiliary layer 20 and the support plate 30 in the first region A1 is less than the sum of the thicknesses of the bending auxiliary layer 20 and the support plate 30 in the second region A2, and the adhesive layer 40 is filled between the bending auxiliary layer 20 and the support plate 30 with a smaller sum of the thicknesses of the bending auxiliary layer 20 and the support plate 30. Therefore, the thickness of the adhesive layer 40 that can be filled between the bending auxiliary layer 20 and the support plate 30 may be relatively large; and the thickness of the adhesive layer 40 may be greater than or equal to the difference between the sum of the thicknesses of the bending auxiliary layer 20 and the support plate 30 in the second region A2 and the sum of the thicknesses of the bending auxiliary layer 20 and the support plate 30 in the first region A1, that is (h4+h2)−(h1+h3). When the thickness of the adhesive layer is small, for example, the thickness of the adhesive layer is equivalent to or slightly larger than the size of a particle, the adhesive layer may not completely cover the particle, and air bubbles may be easily generated at such position of the adhesive layer. In the present application, the thickness of the adhesive layer 40 is relatively large, and the adhesive layer 40 may easily cover the particles on the surfaces of the support plate 30 and the bending auxiliary layer 20 that are in direct contact with the adhesive layer 40, or easily cover uneven surfaces (e.g., slightly concave or convex surfaces) of the support plate 30 and the bending auxiliary layer 20 that are in direct contact with the adhesive layer 40. Therefore, air bubbles may not be easily generated between the adhesive layer 40 and the support plate 30 and between the adhesive layer 40 and the bending auxiliary layer 20, which may be beneficial for improving the adhesive effect between the adhesive layer 40 and each of the support plate 30 and the bending auxiliary layer 20, reducing film separation between the bending auxiliary layer 20 and the support plate 30 under the action of bending stress, and furthermore beneficial for improving the fixing reliability between the bending auxiliary layer 20 and the support plate 30.

Optionally, the adhesive layer 40 mentioned in the present disclosure can be made of an adhesive material, including a pressure-sensitive adhesive, a double-sided adhesive, or a hydrogel (e.g., optical clear resin (OCR)). It should be noted that when the hydrogel is used to form the adhesive layer 40, the hydrogel may be formed on the support plate 40 or on the bending auxiliary layer 20 by coating, and then attached with another part (the bending auxiliary layer 20 or the support plate 40).

In an optional embodiment of the present disclosure, the material of the bending auxiliary layer 20 may include an alloy. Optionally, the bending auxiliary layer 20 may be made of an alloy material including a copper-nickel alloy, a titanium alloy and the like, and may also be made of a stainless-steel material and the like. The bending auxiliary layer 20 may support the flexible display panel 10 on the premise that the flexible display panel 10 can be bent. The alloy may have a certain rigidity, such that the bending auxiliary layer 20 can support the flexible display panel 10 to a certain extent in the unbent state of the display device 100, thereby avoiding bending deformation or creases of the flexible display panel 10. In the bent state of the display device 100, the bending auxiliary layer 20 with a certain rigidity may support the portion of the flexible display panel 10 located in the first region A1 to a certain extent, thereby avoiding bending deformation or creases in the unbending portion of the flexible display panel 10.

Optionally, the support plate 30 in the present disclosure may be made of a same material as the bending auxiliary layer 20. For example, the support plate 30 may be made of an alloy material. When the support plate 30 may be made of an alloy material, the elastic modulus range of the support plate may be within the range of 50 Gpa-300 Gpa. For example, when the support plate is made of stainless steel, the elastic modulus of the support plate 30 may be in the range of 150 Gpa-210 Gpa, for example, about 193 Gpa. When the support plate is made of a copper alloy, the elastic modulus of the support plate 30 may be in the range of 70 Gpa-150 Gpa, for example, about 110 Gpa.

Figure 4:
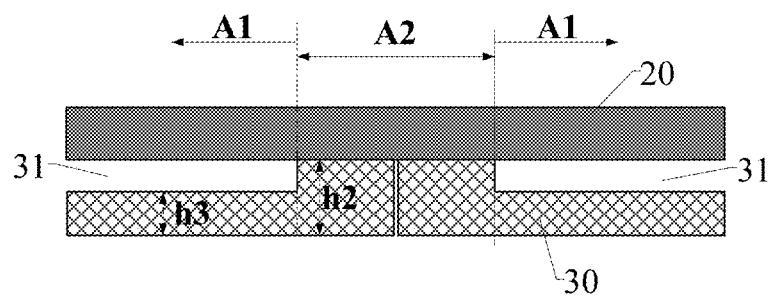
FIG. 4 illustrates a schematic showing a relative positional relationship between a support plate and a bending auxiliary layer according to various embodiments of the present disclosure.
Figure 5:
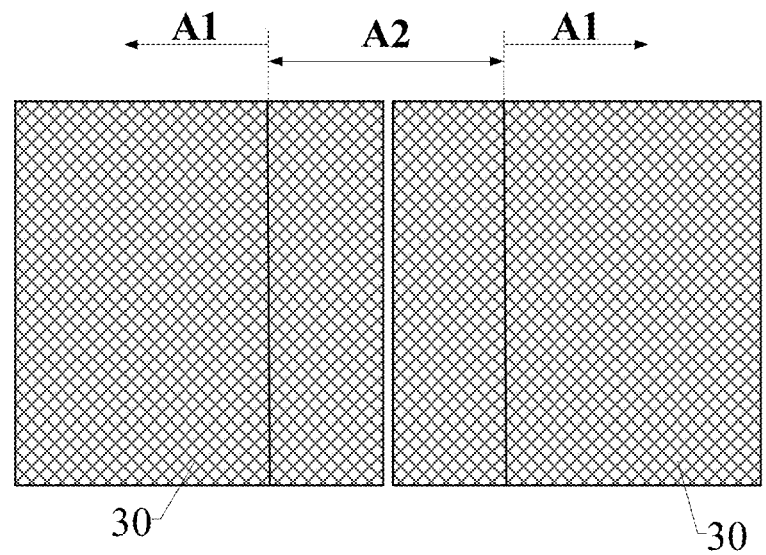
FIG. 5 illustrates a top view of a support plate according to various embodiments of the present disclosure.

In an optional embodiment of the present disclosure, FIG. 4 illustrates a schematic showing a relative positional relationship between the support plate 30 and the bending auxiliary layer 20 according to various embodiments of the present disclosure; and FIG. 5 illustrates a top view of the support plate 30 according to various embodiments of the present disclosure.

In order to clearly show a first recessed-portion 31 on the support plate 30, the adhesive layer 40 located in the first recessed-portion 31 is not shown in FIG. 4. The positional relationship between the adhesive layer 40 and the first recessed-portion 31 may refer to FIG. 2. Referring to FIGS. 2, 4, and 5, the support plate 30 may include the first recessed-portion 31 which is located in the first region A1; and at least a portion of the adhesive layer 40 may be filled in the first recessed-portion 31. In some embodiments, the adhesive layer 40 may be completely filled in the first recessed-portion 31. It should be noted that the bending auxiliary layer 20 in the embodiments shown in FIGS. 2 and 4 may not be disposed with a recessed-portion, and h1 is equal to h4 at this point.

In the embodiments of the present disclosure, the first recessed-portion 31 may be disposed in a portion of the support plate 30 located in the first region A1, the first recessed-portion 31 may be located on the side of the support plate 30 facing toward the bending auxiliary layer 20, and the adhesive layer 40 may be filled in the first recessed-portion 31. In other words, the first recessed-portion 31 is formed on the support plate 30 in the present disclosure, such that the sum of the thicknesses of the support plate 30 and the bending auxiliary layer 20 in the first region A1 may be less than the sum of the thicknesses of the support plate 30 and the bending auxiliary layer 20 in the second region A2; and the difference between the sums of thicknesses ((H4+h2)−(h1+h3)) may be the depth of the first recessed-portion 31. In the present disclosure, the adhesive layer 40 may be filled in the first recessed-portion 31, which may not only implement the fixation between the bending auxiliary layer 20 and the support plate 30 in the first region A1, but also reduce the spacing between the bending auxiliary layer 20 and the support plate 30 in the second region A2. In such way, in the unbent state of the display device 100, the portion of the support plate 30 located in the second region A2 may support the bending auxiliary layer 20 and the flexible display panel 10, and a new support structure or leveling structure may not need to be introduced in the second region A2, which may reduce the creases on the display device 100 and be beneficial for saving production costs.

In the existing technology, if the surfaces adjacent to the bending auxiliary layer and the support plate are both planar structures, when the bending auxiliary layer and the support plate are attached by the adhesive layer, misalignment deviation may be between the bending auxiliary layer and the support plate due to the limited attaching precision. In the bending and unbending operations of the display device, the flexible display panel may be passively bent or unbent due to the bending and unbending operations of a folding module in the display device. If the attaching deviation is between the bending auxiliary layer and the support plate, the bending portion of the flexible display panel determined by the folding module (i.e., the actual bending portion of the flexible display panel under the driving of the folding module) may be relatively deviated from the bending portion of the flexible display panel jointly defined by the support plate, the adhesive layer and the bending auxiliary layer (e.g., the portion of the flexible display panel which is fixedly connected by the support plate may not be bent, and the portion of the flexible display panel which is not fixedly connected to the support plate may be bent). For example, the bending portion of the flexible display panel determined by the folding module may overlap the portion of the flexible panel fixed by the support plate. Limited by the adhesive force of the adhesive layer, although the flexible display panel may not be bent at the position where the adhesive layer is disposed, the edge of the adhesive layer may be pulled upward by a force, such that the flexible display panel may be affected at such position (the position corresponding to the edge of the adhesive layer), resulting in abnormal display of the flexible display panel.

In view of the above-mentioned defects, in the display device 100 of the present disclosure, the first recessed-portion 31 may be introduced on the support plate 30, and the adhesive layer 40 may be filled in the first recessed-portion 31. The first recessed-portion 31 may be configured to attach and align the adhesive layer 40. When the bending auxiliary layer 20 and the support plate 30 are attached by the adhesive layer 40, the first recessed-portion 31 may be used to accurately define the position of the adhesive layer 40. Therefore, the alignment deviation between the bending auxiliary layer 20 and the support plate 30 may be greatly reduced, which may be beneficial for ensuring the accuracy of the region where the flexible display panel 10 is bent and avoiding the abnormal display of the flexible display panel 10 in the display device 100 due to the misalignment deviation of the bending auxiliary layer 20 and the support plate 30.

In an alternative embodiment of the present disclosure, referring to FIG. 4, the ratio R0 (i.e., h3/h2) of the thickness h3 of the first recessed-portion 31 over the thickness h2 of the support plate 30 in the second region A2 may satisfy $1/4 \leq R0 \leq 3/4$.

For example, the first recessed-portion 31 disposed on the support plate 30 in the present disclosure may be obtained by removing a partial structure of the flat support plate 30, which is equivalent to obtaining the first recessed-portion by digging a trench on the flat support plate 30, and also be obtained by adding a partial structure to the flat support plate 30. When the first recessed-portion 31 is obtained by removing the partial structure of the flat support plate 30, the thickness h3 of the first recessed-portion 31 may refer to the thickness of the remaining portion of the support plate 30 in the thinned region after thinning, and the thickness h2 of the support plate 30 in the second region A2 may refer to the thickness of the support plate 30 at the region where a portion of the support plate 30 is not removed. When the first recessed-portion 31 is obtained by adding the partial structure to the flat support plate 30, the thickness h3 of the first recessed-portion 31 may refer to the thickness of the support plate 30 before adding the structure, and the thickness h2 of the support plate 30 in the second region A2 may refer to the total thickness of the added structure and the support plate 30 after the structure is added to the support plate 30. The first recessed-portion 31 disposed on the support plate 30, which is obtained by removing the partial the structure of the flat support plate 30, may be taken as an example in the embodiment of FIG. 4.

Considering that the thickness and rigidity of the first recessed-portion 31 are generally positively correlated, when the ratio R0 of the thickness h3 of the first recessed-portion 31 over the thickness h2 of the support plate 30 in the second region A2 is configured to be less than $1/4$, it may result in that the thickness and rigidity of the first recessed-portion 31 become relatively small which is difficult to provide desirable support for the flexible display panel 10 above the first recessed-portion 31. In such way, the supporting strength of the flexible display panel 10 in the first region A1 and the second region A2 may be greatly different, which may extremely likely cause the flexible display panel 10 to have creases in the region corresponding to the first recessed-portion 31. Furthermore, the thickness of the first recessed-portion 31 is inversely correlated to the thickness of the adhesive layer 40 that can be filled in the first recessed-portion 31 may be considered. That is, the greater the thickness of the first recessed-portion 31, the smaller the thickness of the adhesive layer 40 that can be filled in the first recessed-portion 31. When the ratio R0 of the thickness of the first recessed-portion 31 over the thickness of the support plate 30 in the second region A2 is configured to be $R0 > 3/4$, it may result in that the thickness of the adhesive layer 40 that can be filled in the first recessed-portion 31 is relatively small. On the one hand, it is not beneficial for the reliable fixation between the support plate 30 and the bending auxiliary layer 20; on the other hand, when the thickness of the adhesive layer 40 is relatively small, small bubbles generated by the adhesive layer 40 may gradually evolve into large bubbles, which may eventually result in film separation between the support plate 30 and the bending auxiliary layer 20.

The ratio R0 of the thickness of the first recessed-portion 31 over the thickness of the support plate 30 in the second region A2 may be configured to be $1/4 \leq R0 \leq 3/4$. On the one hand, it is beneficial for ensuring that the support plate 30 has a certain rigidity in the region corresponding to the first recessed-portion 31, which may reliably support the flexible display panel 10 and the bending auxiliary layer 20, reducing the difference in the supporting force received by the flexible display panel 10 between the region where the first recessed-portion 31 is located and other region, thereby being beneficial for avoiding the creases in the region corresponding to the first recessed-portion 31 of the flexible display panel 10. On the other hand, it is beneficial for ensuring that the thickness of the adhesive layer 40 that can be filled in the first recessed-portion 31 is not extremely small, which may avoid film separation due to large air bubbles in the adhesive layer 40, thereby being beneficial for improving the fixing reliability between the bending auxiliary layer 20 and the support plate 30.

Optionally, when the support plate is made of stainless steel, the thickness range of the support plate in the second region may be from about 200 µm to about 300 µm. When the thickness of the support plate in the second region is 200 µm, the thickness range of the support plate in the first region (corresponding to the thickness range of the first recessed-portion 31) may be, optionally, from about 100 µm to about 150 µm; and when the thickness of the support plate in the second region is 300 µm, the thickness range of the first recessed-portion 31 may be, optionally, from about 150 µm to about 225 µm.

When the support plate is made of a copper alloy material, the thickness range of the support plate in the second region may be, optionally, from about 70 µm to about 80 µm, and the thickness of the support plate in the first region (corresponding to the thickness range of the first recessed-portion 31) may be, optionally, from about 35 µm to about 60 µm.

Optionally, the ratio R0 of the thickness h3 of the first recessed-portion 31 over the thickness h2 of the support plate 30 in the second region A2 in the present disclosure may be configured as ¼, ⅜, ½, ⅝, ¾, and the like. When R0=½, in the first region, the support plate 30 may not only provide a reliable supporting force, but also provide an accommodation space for the adhesive layer; and the thickness of the adhesive layer may also be taken into account.

Figure 6:
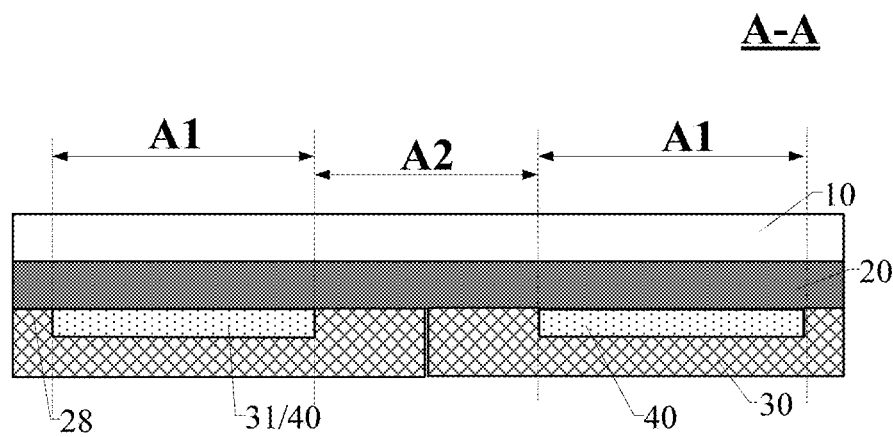
FIG. 6 illustrates another cross-sectional schematic of a display device along an AA line in FIG. 1.
Figure 7:
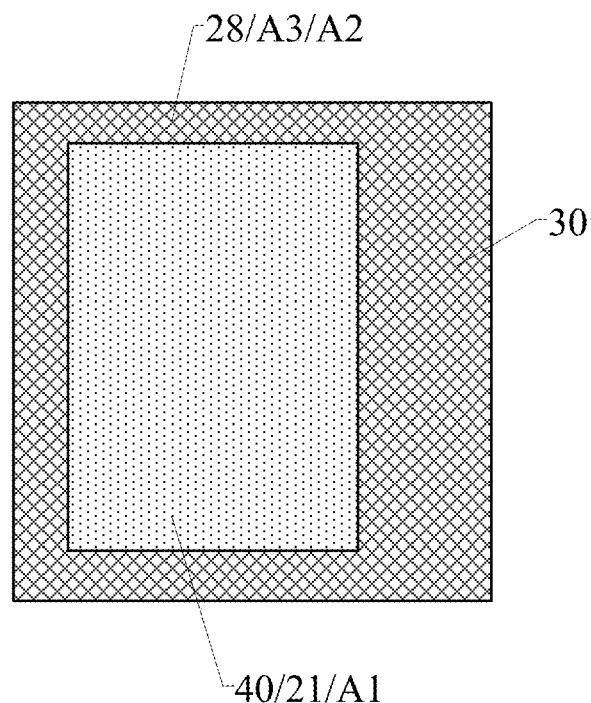
FIG. 7 illustrates a top schematic view of a support plate and an adhesive layer.

In an alternative embodiment of the present disclosure, FIG. 6 illustrates another cross-sectional schematic of the display device 100 along the AA line in FIG. 1; and FIG. 7 illustrates a top schematic view of the support plate 30 and the adhesive layer 40. It should be noted that the display device in FIG. 6 includes two support plates 30, and FIG. 7 is a schematic of one of the support plates 30 and its corresponding adhesive layer 40 for illustration. The support plate 30 may include a retaining wall 28 that surrounds the first recessed-portion 31.

For example, the embodiments shown in FIGS. 6 and 7 may illustrate a schematic structural view of the support plate 30 further including the retaining wall 28 disposed by surrounding the first recessed-portion 31. When the adhesive layer 40 is filled in the first recessed-portion 31, the adhesive layer 40 may be confined in the space defined by the retaining wall 28 and the first recessed-portion 31. When the adhesive layer 40 is formed in the first recessed-portion 31 in a liquid state, the retaining wall 28 disposed on the support plate 30 of the present disclosure may effectively reduce adhesive overflow of the adhesive layer 40 during the formation process. It should be noted that when the adhesive overflow occurs, the adhesive may extremely likely overflow to the location between the bending auxiliary layer 20 and the support plate 30 in the second region A2, resulting in that the display device 100 cannot be bent normally or the bending effect is poor. In the present disclosure, after the retaining wall 28 is disposed on the support plate 30, the problem of the display device 100 being unable to be bent normally or having poor bending effect due to the adhesive overflow of the adhesive layer 40 may be effectively avoided. Furthermore, when the retaining wall 28 is disposed on the support plate 30, the adhesive layer 40 may be filled in the entire space formed by the first recessed-portion 31 and the retaining wall 28, and be adhered to the side of the retaining wall 28 to increase the contact area between the adhesive layer 40 and the support plate 30, thereby being beneficial for improving the adhesion reliability between the support plate 30 and the adhesive layer 40, and effectively avoiding breakage or unstable adhesion between the support plate 30 and the adhesive layer 40.

It should be noted that the region where the retaining wall 28 is located on the support plate 30 is a third region A3, which overlaps the second region A2 of the present disclosure.

Figure 8:
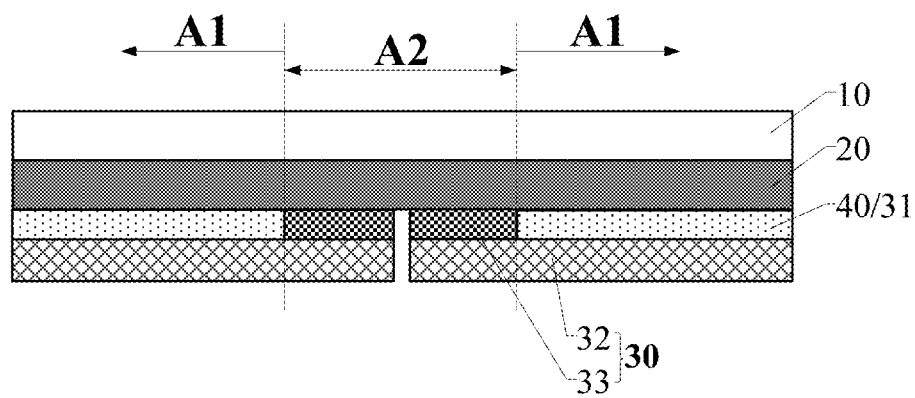
FIG. 8 illustrates another cross-sectional schematic of a display device along an AA line in FIG. 1.

The first recessed-portion 31 in the embodiments shown in FIGS. 2, 4, and 6 may be considered to be formed by removing a partial structure from the support plate 30, that is, the support plate 30 may be a single piece structure. In an optional embodiment of the present disclosure, the first recessed-portion 31 may also be formed by adding a partial structure to the support plate 30. For example, referring to FIG. 8. FIG. 8 illustrates another cross-sectional schematic of the display device 100 along the AA line in FIG. 1. The support plate 30 may include a base 32, and a protruding portion 33 which is disposed on and connected to the base 32 and exposes a portion of the base 32. The first recessed-portion 31 may be provided between the bending auxiliary layer 20 and the exposed portion of the base 32, and adjacent to the protruding portion 33.

Referring to FIG. 8, the support plate 30 in one embodiment may include two parts, which are the base 32 and the protruding portion 33 respectively. The protruding portion 33 may be disposed on the base 32, that is, the protruding portion 33 may be a protruding structure compared to the base 32, such that the first recessed-portion 31 of the support plate 30 may be formed at the region on the base 32 where the protruding portion 33 is not disposed. The first recessed-portion 31 formed in such way may also play a role of attaching and aligning the adhesive layer 40. When the bending auxiliary layer 20 and the support plate 30 are attached by the adhesive layer 40, the first recessed-portion 31 may be used to accurately define the position of the adhesive layer 40. Therefore, the alignment deviation between the bending auxiliary layer 20 and the support plate 30 may be greatly reduced, which may be beneficial for ensuring the accuracy of the region where the flexible display panel 10 is bent and for avoiding the abnormal display of the flexible display panel 10 in the display device 100 due to the misalignment deviation of the bending auxiliary layer 20 and the support plate 30.

It should be noted that when the support plate 30 includes the base 32 and the protruding portion 33, the protruding portion 33 may be formed on the base 32 of the support plate 30 using an electroplating process, a press soldering process, or a bending process. In such way, the protruding portion 33 and the base 32 may be a single piece structure, rather than a structure formed by adhering the protruding portion with the base through the adhesive layer. When the protruding portion is formed by a bending process, it is equivalent to bending the edge portion of the support plate 30 to form the protruding portion 33. At this point, the composing materials of the protruding portion 33 and the base 32 may be completely same. When an electroplating process or a press soldering process is used to form the protruding portion 33, the material of the protrusion 33 may be different from the material of the base 32. For example, when the protruding portion 33 is formed by an electroplating process, the material used for the protruding portion 33 may be a metal material such as nickel; and when a press soldering process is used to form the protruding portion 33, the material for the protruding portion 33 may be a metal material such as copper.

Figure 9:
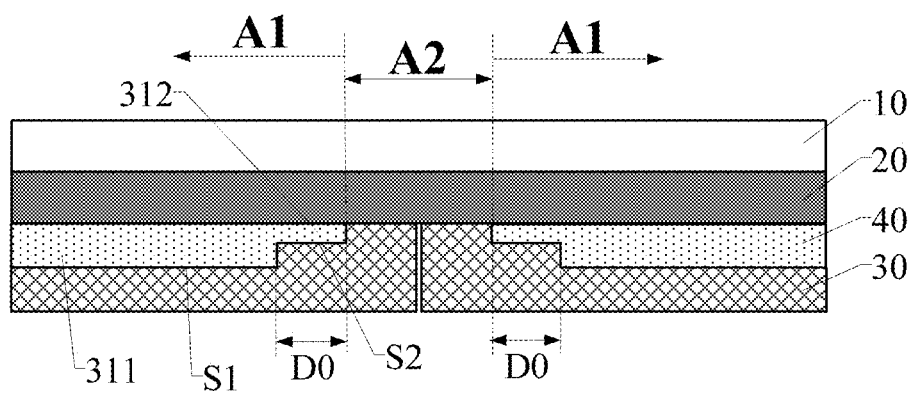
FIG. 9 illustrates another cross-sectional schematic of a display device along an AA line in FIG. 1.
Figure 10:
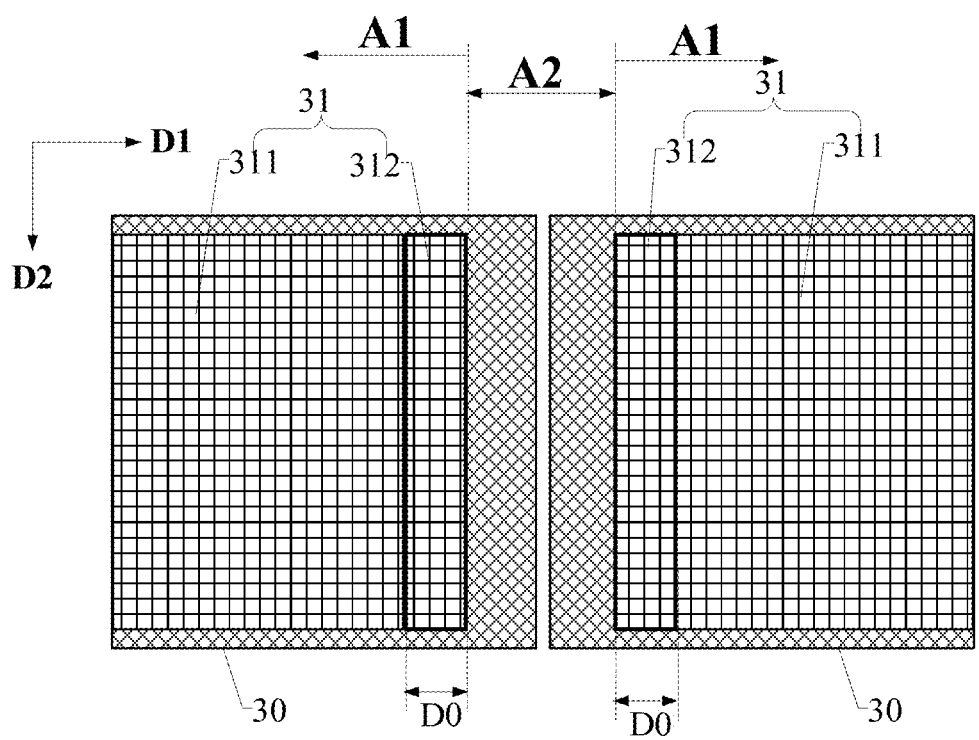
FIG. 10 illustrates a top view of a first sub-recessed-portion and a second sub-recessed-portion disposed on a support plate.

In an alternative embodiment of the present disclosure, FIG. 9 illustrates another cross-sectional schematic of the display device 100 along the AA line in FIG. 1; and FIG. 10 illustrates a top view of a first sub-recessed-portion 311 and a second sub-recessed-portion 312 disposed on the support plate 30. Referring to FIGS. 9-10, the first recessed-portion 31 may include the first sub-recessed-portion 311 and the second sub-recessed-portion 312 that are connected to each other, and the second sub-recessed-portion 312 may be located at the side of the first sub-recessed-portion 311 adjacent to the second region A2. The first sub-recessed-portion 311 may include a first surface S1 facing toward the adhesive layer 40, and the second sub-recessed-portion 312 may include a second surface S2 facing toward the adhesive layer 40. The distance between the second surface S2 and the bending auxiliary layer 20 may be less than the distance between the first surface S1 and the bending auxiliary layer 20, which is equivalent to that the thickness of the second sub-recessed-portion 312 may be greater than the thickness of the first sub-recessed-portion 311.

For example, the embodiments shown in FIGS. 9 and 10 may illustrate a case where the first recessed-portion 31 on the support plate includes two sub-recessed-portions, and the two sub-recessed-portions are the first sub-recessed-portion 311 and the second sub-recessed-portion 312, respectively. The number of the second sub-recessed-portion 312 corresponding to one first sub-recessed-portion 311 may be one, and the first sub-recessed-portion 311 and the second sub-recessed-portion 312 may both be embodied as long strip structures extending along a second direction D2. When the adhesive layer 40 is formed by filling the liquid adhesive in the first recessed-portion 31, the liquid adhesive may be first filled in the first sub-recessed-portion 311. The second sub-recessed-portion 312 may be introduced at the side of the first sub-recessed-portion 311 facing toward the second region A2 in the present disclosure. When the thickness of the second sub-recessed-portion 312 is greater than the thickness of the first sub-recessed-portion 311, the introduction of the second sub-recessed-portion 312 may buffer the liquid adhesive to a certain extent, which may prevent the liquid adhesive from overflowing between the bending auxiliary layer 20 and the support portion at the second region A2 to cause the display device 100 to not be bent normally. Therefore, the function of the second sub-recessed-portion 312 to prevent adhesive overflow may also be beneficial for improving the bending reliability of the display device 100.

Figure 11:
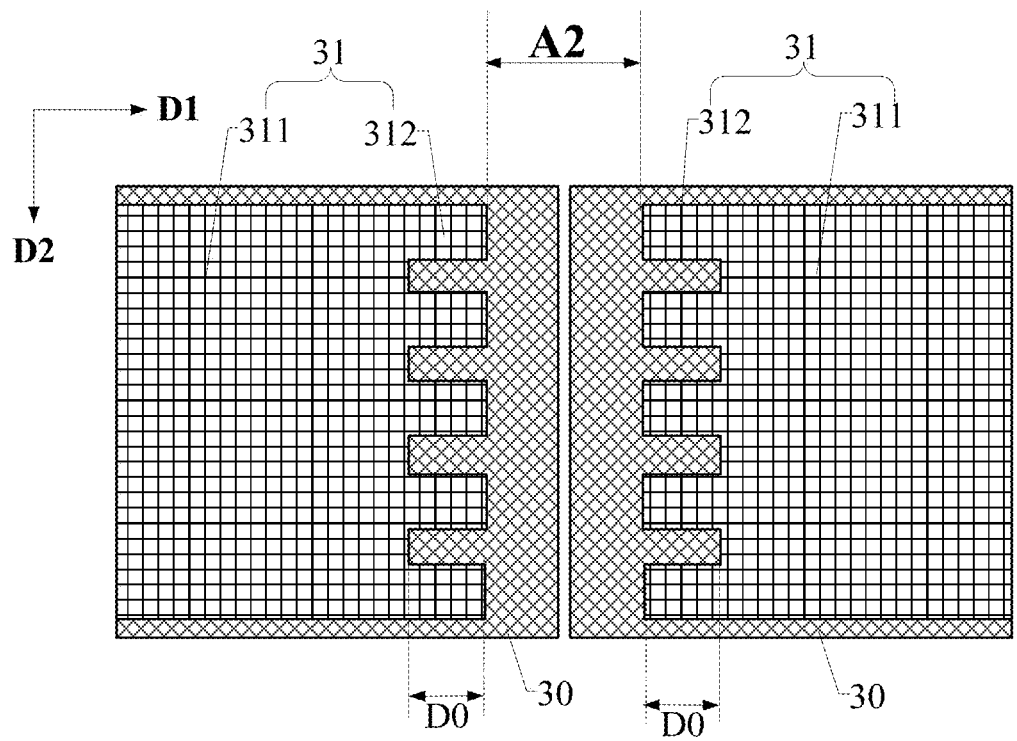
FIG. 11 illustrates another top view of a first sub-recessed-portion and a second sub-recessed-portion disposed on a support plate.

In an alternative embodiment of the present disclosure, FIG. 11 illustrates another top view of the first sub-recessed-portion 311 and the second sub-recessed-portion 312 disposed on the support plate 30. The number of the second sub-recessed-portion 312 may be more than one. The first sub-recessed-portion 311 and a structure including a plurality of second sub-recessed-portions 312 may be arranged along a first direction D1, and the plurality of the second sub-recessed-portions 312 may be arranged along a second direction D2, where the first direction D1 intersects the second direction D2.

For example, the embodiment shown in FIG. 11 may illustrate the relative positional relationship, from another viewing-angle, between the first sub-recessed-portion 311 and the second sub-recessed-portion 312 on the support portion. Referring to FIGS. 9 and 11, the plurality of second sub-recessed-portions 312 may be introduced between the first sub-recessed-portions 311 and the second region A2, and the second sub-recessed-portions 312 may be arranged along the second direction D2. In the process of forming the adhesive layer 40, when the first recessed-portion 31 is filled with the liquid adhesive, a portion of the liquid adhesive that continues to be filled may be filled into the second sub-recessed-portion 312. When the plurality of second sub-recessed-portions 312 are introduced between the first sub-recessed-portions 311 and the second region A2, the plurality of second sub-recessed-portions 312 may effectively prevent the liquid adhesive from flowing to the second region A2, which is equivalent to blocking the flow of the liquid adhesive. That is, the plurality of second sub-recessed-portions 312 may better prevent adhesive overflow, which is beneficial for improving the bending reliability of the display device 100. The second sub-recessed-portions 312 may be disposed between the first sub-recessed-portions 311 and the second region A as a transition region.

Optionally, along the first direction D1, the length D0 of the second sub-recessed-portion 312 may be configured to be 0.1 mm-0.2 mm (including endpoint values), for example, 0.1 mm, 0.12 mm, 0.15 mm, 0.18 mm, 0.2 mm, or the like, such that the second sub-recessed-portions 312 may better prevent adhesive overflow.

Figure 12:
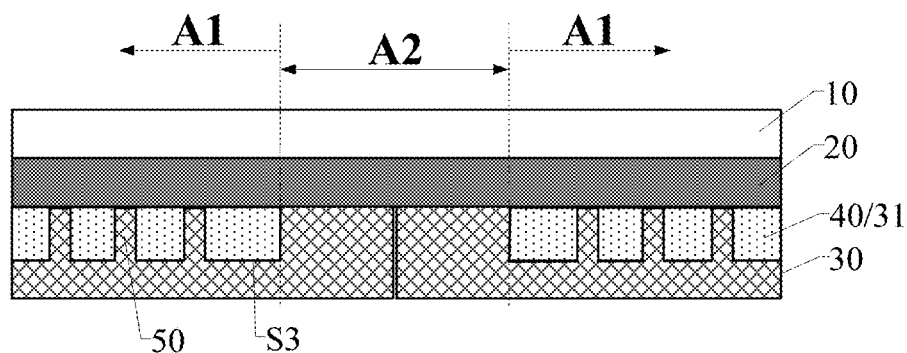
FIG. 12 illustrates another cross-sectional schematic of a display device along an AA line in FIG. 1.

In an optional embodiment of the present disclosure, FIG. 12 illustrates another cross-sectional schematic of the display device 100 along the AA line in FIG. 1. The support plate 30 may further include a reinforcing pattern 50 which is in the first recessed-portion 31. The first recessed-portion 31 may include a third surface S3 facing toward the adhesive layer 40, and the reinforcing pattern 50 may be directly connected to the third surface S3. The distance between the reinforcing pattern 50 and the bending auxiliary layer 20 may be less than the distance between the third surface S3 and the bending auxiliary layer 20.

For example, FIG. 12 illustrates a case where the support plate 30 further includes the reinforcing pattern 50. The reinforcing pattern 50 on the support plate 30 may be located in the first recessed-portion 31, where the distance between the reinforcing pattern 50 and the bending auxiliary layer 20 may be less than the distance between the third surface S3 of the first recessed-portion 31 facing toward the adhesive layer 40 and the bending auxiliary layer 20. In other words, the reinforcing pattern 50 may be equivalent to a protruding structure disposed in the first recessed-portion 31. When the reinforcing pattern 50 is disposed in the first recessed-portion 31 and the adhesive layer 40 is filled in the first recessed-portion 31, the adhesive layer 40 may be in directly contact with each side surface of the reinforcing pattern 50, which is equivalent to increasing the contact area between the adhesive layer 40 and the support plate 30, thereby being beneficial for improving the adhesion reliability between the adhesive layer 40 and the support plate 30. Furthermore, the reinforcing pattern 50 may be disposed to increase the supporting strength of the first recessed-portion 31.

It should be noted that when the first recessed-portion 31 in the support plate 30 may be formed by removing a partial structure in the support plate 30, the reinforcing pattern 50 in the first recessed-portion 31 may be a portion of the support plate 30 that remains unremoved in the range of the first recessed-portion 31. When the first recessed-portion 31 in the support plate 30 is formed by adding a partial structure to the support plate 30, the reinforcing pattern 50 may be an additional structure in the first recessed-portion 31. The reinforcing pattern 50, which is a partial structure of the support plate 30 retained during the process of forming the first recessed-portion 31, may be taken as an example for illustration in FIG. 12.

Figure 13:
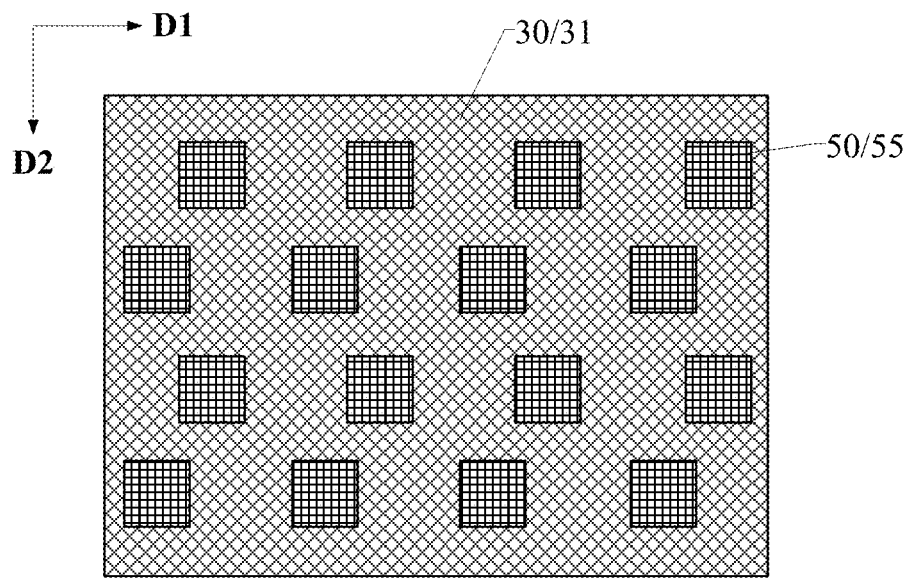
FIG. 13 illustrates a top structural view of a support plate disposed with a reinforcing pattern.

In alternative embodiment of the present disclosure, FIG. 13 illustrates a top structural view of the support plate 30 disposed with the reinforcing pattern. It should be noted that FIG. 13 only illustrates the reinforcing pattern 50 on one support plate 30. The reinforcing pattern 50 may include a plurality of reinforcing sub-patterns 55 which is discretely disposed in the first recessed-portion 31. For example, when the plurality of reinforcing sub-patterns 55 are disposed in the first recessed-portion 31, the sides of the plurality of reinforcing sub-patterns 55 may all be in directly contact with the adhesive layer 40, which is more beneficial for increasing the effective contact area between the adhesive layer 40 and the support plate 30 and improving the adhesion reliability between the support plate 30 and the adhesive layer 40. It should be noted that FIG. 13 only illustrates one arrangement of the reinforcing sub-patterns 55 in the first recessed-portion 31. In some other embodiments of the present disclosure, the reinforcing sub-patterns 55 may also be arranged in other manners, which may not be limited according to various embodiments of the present disclosure. Furthermore, FIGS. 12-13 only illustrate the reinforcing sub-patterns, which may not represent the actual number and size.

Optionally, the shape of the reinforcing sub-pattern 55 disposed in the first recessed-portion 31 in a top view may be, for example, at least one of a circle, a rectangle, a triangle, an ellipse, and a rhombus. FIG. 13 may only take the rectangular top view of the reinforcing sub-pattern 55 as an example for illustration. In a three-dimensional structure, the reinforcing sub-pattern 55 disposed in the first recessed-portion 31 may be a vertically (a direction perpendicular to the plane where the support plate 30 is located) relatively long column, or a horizontally (the direction in parallel with the plane where the support plate 30 is located) relatively long column, pyramid, or the like.

Figure 14:
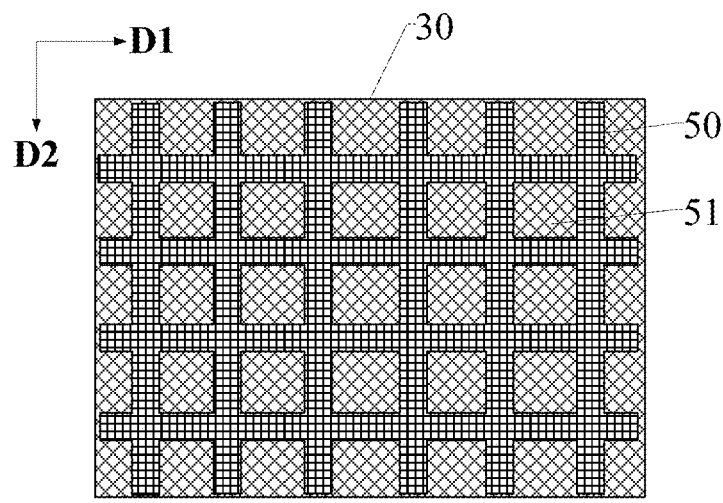
FIG. 14 illustrates another top structural view of a support plate disposed with a reinforcing pattern.

In an alternative embodiment of the present disclosure, FIG. 14 illustrates another top structural view of the support plate 30 disposed with the mesh-shaped reinforcing pattern 50. Referring to FIGS. 12 and 14, when the reinforcing pattern 50 is configured as the mesh structure as shown in FIG. 14, the adhesive layer 40, which is filled in each mesh opening 51 of the mesh structure, may be in close contact with the sidewalls of each mesh opening 51; and inside of each mesh opening 51, the adhesive layer 40 may be in close contact with the sidewalls of the reinforcing pattern 50 and the surface of the support plate 30 facing toward the adhesive, thereby further improving the adhesion reliability between the adhesive layer 40 and the support plate 30. Moreover, the mesh-shaped reinforcing pattern 50 may also be beneficial for improving the uniformity of the adhesion between the adhesive layer 40 and the support plate 30 in each region of the first recessed-portion 31 and effectively avoiding the film separation of the adhesive layer 40 and the support plate 30 when the display device 100 is bent. Meanwhile, the mesh-shaped reinforcing pattern 50 may improve the overall supporting strength of the first recessed-portion 31.

The mesh structure formed by the horizontal and vertical crossing mesh lines may be illustrated in FIG. 14. The reinforcing pattern in present application may also be a honeycomb mesh formed by a plurality of hexagons closely arranged, or a mesh formed by irregular shapes.

Figure 15:
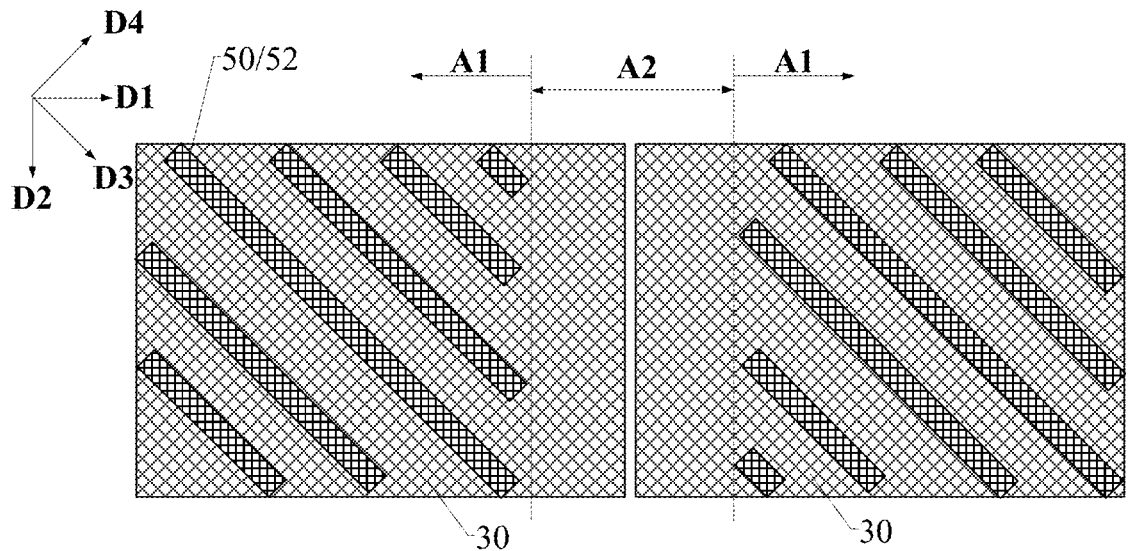
FIG. 15 illustrates another top structural view of a support plate disposed with a reinforcing pattern.

In an alternative embodiment of the present disclosure, FIG. 15 illustrates another top structural view of the support plate 30 disposed with the reinforcing pattern 50. The reinforcing pattern 50 may include a plurality of reinforcing strips 52 which extends along a third direction D3 and is arranged along a fourth direction D4.

Optionally, referring to FIG. 15, the third direction D3 intersects the fourth direction D4, the third direction D3 intersects the first direction D1, and the angle between the third direction D3 and the first direction D1 is an acute angle. Referring to FIGS. 11 and 14, when the display device 100 is bent, a relatively large tensile stress along the first direction D1 may be received between the support plate 30 and the adhesive layer 40. In the present disclosure, when the plurality of reinforcing strips 52 extending along the third direction D3 and arranged along the fourth direction D4 are disposed in the first recessed-portion 31, the extending direction of the reinforcing strips 52 may intersect the first direction D1 with the relatively large tensile stress, and the introduction of the reinforcing strips 52 may effectively weaken the tensile stress received by the support plate 30 and the adhesive layer 40 along the first direction D1, which may reduce the possibility of the film separation between the support plate 30 and the adhesive layer 40 when the display device 100 is bent, thereby being more beneficial for improving the adhesion reliability between the support plate 30 and the adhesive layer 40.

Figure 16:
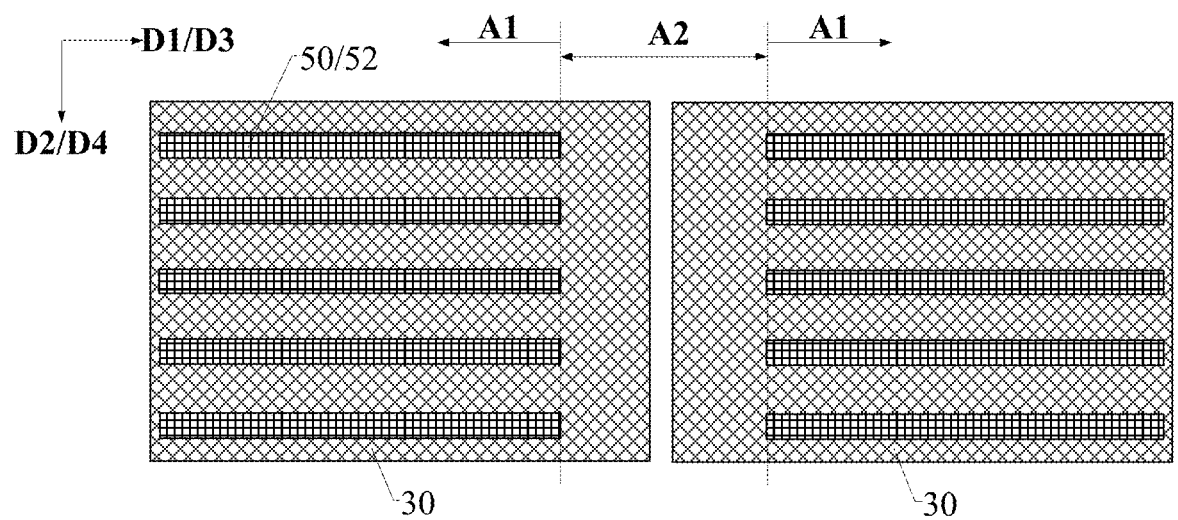
FIG. 16 illustrates another top structural view of a support plate disposed with a reinforcing pattern.

Optionally, FIG. 16 illustrates another top structural view of the support plate 30 disposed with the reinforcing pattern 50. The third direction D3 may be same as the first direction D1, and the third direction D3 may intersect the fourth direction D4. At this point, the extending direction of the reinforcing strips 52 may be same as the arrangement direction of the first sub-recessed-portions 311 and the second sub-recessed-portions 312. Such arrangement of the reinforcing strip 52 may also be beneficial for increasing the contact area between the adhesive layer 40 and the support plate 30 and improving the adhesion reliability between the adhesive layer 40 and the support plate 30.

Figure 17:
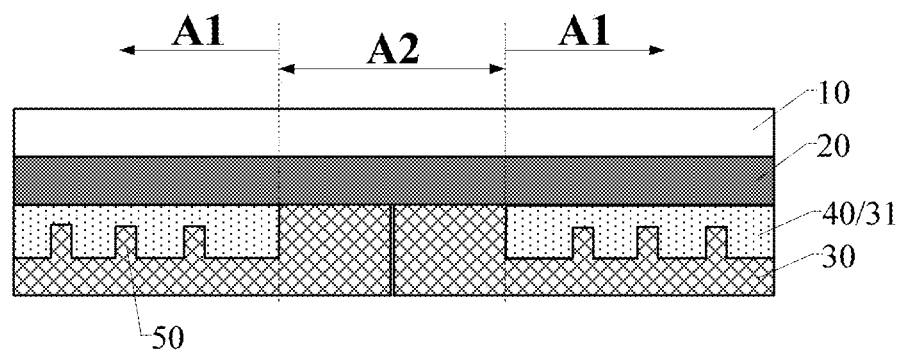
FIG. 17 illustrates another cross-sectional schematic of a display device along an AA line in FIG. 1.

In an optional embodiment of the present disclosure, FIG. 17 illustrates another cross-sectional schematic of the display device 100 along the AA line in FIG. 1. The height of the reinforcing pattern 50 may be equal to the depth of the first recessed-portion 31, for example, referring to FIG. 12; or the height of the reinforcing pattern 50 may be less than the depth of the first recessed-portion 31, for example, referring to FIG. 17.

For example, FIGS. 12 and 17 respectively illustrate the schematics of the relative positional relationship between the reinforcing pattern 50 and the first recessed-portion 31. The height of the reinforcing pattern 50 may be equal to the depth of the first recessed-portion 31 in FIG. 12. When the first recessed-portion 31 is obtained by removing a partial structure of the support plate 30, in the process of forming the first recessed-portion 31, the structure of the support plate 30 corresponding to the reinforcing pattern 50 may be retained, and the removing or thinning operations may not be performed on such structure of the support plate 30, thereby forming the above-mentioned reinforcing pattern 50. That is, the reinforcing pattern 50 may be formed simultaneously when forming the first recessed-portion 31, and a new forming process may not need to be added for forming the reinforcing pattern 50. Therefore, while improving the adhesion reliability between the adhesive layer 40 and the support plate 30, it is also beneficial for simplifying the production process of the display device 100 and improving the production efficiency of the display device 100.

The height of the reinforcing pattern 50 may be less than the depth of the first recessed-portion 31 in FIG. 17. When the adhesive is filled in the first recessed-portion 31, the adhesive may be in contact with the sides of the reinforcing pattern 50 and the surface of the reinforcing pattern 50 facing toward the bending auxiliary layer 20. That is, the entire outer surface of the reinforcing pattern 50 may be in contact with the adhesive layer 40, which is beneficial for increasing the effective contact area between the adhesive layer 40 and the reinforcing pattern 50, and further beneficial for increasing the effective contact area between the adhesive layer 40 and the support plate 30 and improving the adhesion between the adhesive layer and the support plate 30. Moreover, the adhesive layer 40 may be disposed as an entire piece and may not be broken at the position disposed with the reinforcing pattern 50, which may reduce the influence on the adhesion, as an entire piece, between the film layers.

Figure 18:
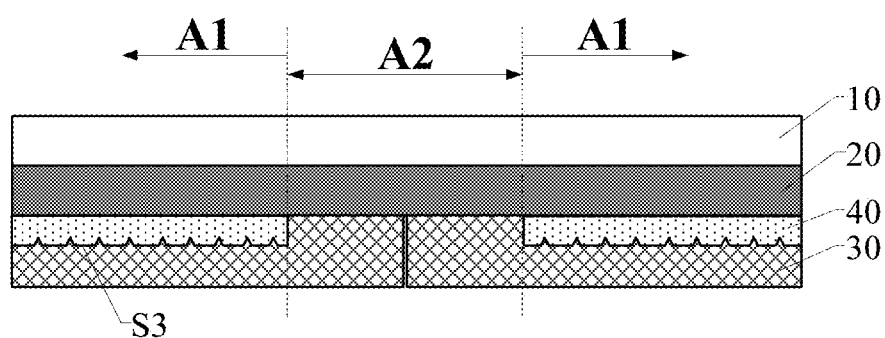
FIG. 18 illustrates another cross-sectional schematic of a display device along an AA line in FIG. 1.

In an optional embodiment of the present disclosure, FIG. 18 illustrates another cross-sectional schematic of the display device 100 along the AA line in FIG. 1. The first recessed-portion 31 may include a third surface S3, which is a rough surface, facing toward the adhesive layer 40.

For example, in one embodiment, the third surface S3 of the first recessed-portion 31 facing toward the adhesive layer 40 may be configured as a rough surface. The rough surface is relative to a smooth surface herein, and the rough surface may indicate that the third surface S3 is a non-smooth surface. Uneven structures such as multiple recesses and protrusions shown in FIG. 18 may be on the third surface S3. It should be noted that the rough surface of the third surface S3 of the present disclosure may be a rough surface with regular structures; for example, the shapes and sizes of the recesses and protrusions on the third surface S3 may be fixed. In some other embodiments of the present disclosure, the third surface S3 may also be embodied as a rough surface with irregular structures; for example, the shapes and sizes of the recesses and protrusions on the third surface S3 may not be completely same. When the third surface S3 is configured as the rough surface, the contact area between the adhesive layer 40 and the rough surface when the adhesive layer 40 contacts the rough surface may be larger than the contact area between the adhesive layer 40 and the smooth surface when the adhesive layer 40 contacts the smooth surface, which is more beneficial for improving the adhesive force between the adhesive layer 40 and the first recessed-portion 31, and further for improving the adhesion reliability between the adhesive layer 40 and the support plate 30.

Figure 19:
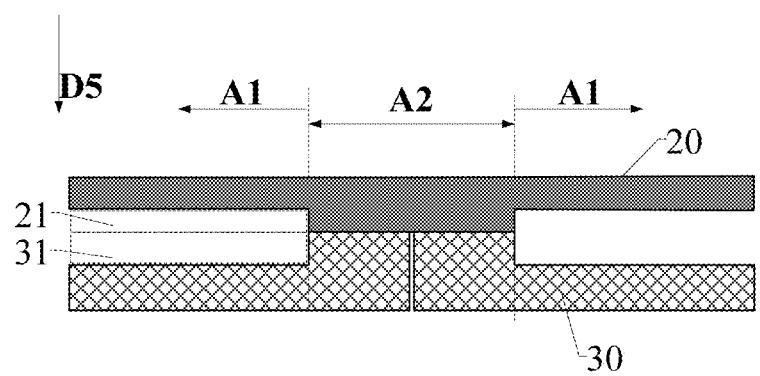
FIG. 19 illustrates another schematic showing a relative positional relationship between a support plate and a bending auxiliary layer according to various embodiments of the present disclosure.

In an alternative embodiment of the present disclosure, FIG. 19 illustrates another schematic showing a relative positional relationship between the support plate 30 and the bending auxiliary layer 20 according to various embodiments of the present disclosure. The bending auxiliary layer 20 may include a second recessed-portion 21 which is located in the first region A1 and along a fifth direction D5. The first recessed-portion 31 of the support plate 30 may overlap the second recessed-portion 21, and the fifth direction D5 may be a direction perpendicular to the plane where the support plate 30 is located. At least a portion of the adhesive layer may be filled in the second recessed-portion 21 (to clearly illustrate the positional relationship between the first recessed-portion 31 and the second recessed-portion 21, the adhesive layer is not shown in FIG. 18).

For example, FIG. 19 illustrates a case where recessed-portions are disposed on both the support plate 30 and the bending auxiliary layer 20, where the recessed-portion on the support plate 30 may be the first recessed-portion 31, and the recessed-portion on the bending auxiliary layer 20 may be the second recessed-portion 21. Along the fifth direction, the first recessed-portion 31 and the second recessed-portion 21 may be overlapped with each other, and the adhesive layer may be filled in the space formed by the first recessed-portion 31 and the second recessed-portion 21. The recessed-portions may be formed on both the support plate 30 and the bending auxiliary layer 20, which is beneficial for increasing the thickness of the adhesive layer 40 filled between the bending auxiliary layer 20 and the support portion in the display device 100. The greater the thickness of the adhesive layer is, the less likely the bubbles are generated. Therefore, the adhesive layer 40 with the increased thickness may be beneficial for avoiding the film separation caused by the formation of bubbles in the adhesive layer and more beneficial for improving the adhesion reliability between the bending auxiliary layer 20, the adhesive layer 40, and the support plate 30.

Figure 20:
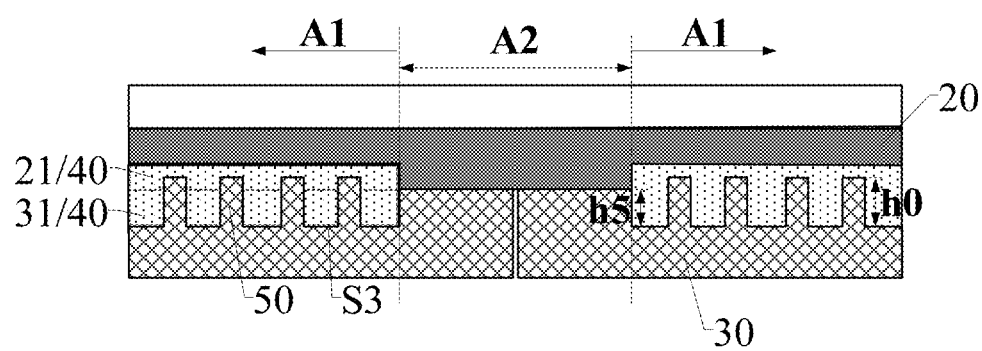
FIG. 20 illustrates another cross-sectional schematic of a display device along an AA line in FIG. 1.

In an optional embodiment of the present disclosure, FIG. 20 illustrates another cross-sectional schematic of the display device 100 along the AA line in FIG. 1. The support plate 30 may further include the reinforcing pattern 50, which is located in the first recessed-portion 31. The first recessed-portion 31 may include the third surface S3 facing toward the adhesive layer 40, and the reinforcing pattern 50 may be directly connected to the third surface S3. A height h0 of the reinforcing pattern 50 may be greater than a depth h5 of the first recessed-portion 31.

For example, FIG. 20 illustrates a case where the reinforcing pattern 50 is disposed in the first recessed-portion 31 at the support plate 30 when the support plate 30 and the bending auxiliary layer 20 are both disposed with recessed-portions. At this point, the height h0 of the reinforcing pattern 50 may be greater than the depth h5 of the first recessed-portion 31, that is, the reinforcing pattern 50 may extend from the first recessed-portion 31 into the second recessed-portion 21. When the adhesive layer 40 is filled in the first recessed-portion 31 and the second recessed-portion 21, the adhesive layer 40 may reliably contact the side surfaces of the reinforcing pattern 50 with a relatively large height, and the effective contact area between the reinforcing pattern 50 and the first recessed-portion 31 may be further increased, thereby being beneficial for improving the adhesion reliability between the adhesive layer 40 and the support plate 30.

Figure 21:
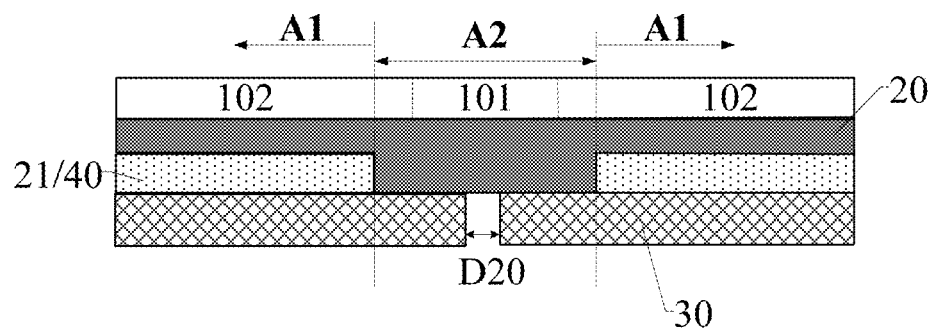
FIG. 21 illustrates another cross-sectional schematic of a display device along an AA line in FIG. 1.

In an alternative embodiment of the present disclosure, FIG. 21 illustrates another cross-sectional schematic of the display device 100 along the AA line in FIG. 1. The bending auxiliary layer 20 may include a second recessed-portion 21, and the adhesive layer 40 may be filled in the second recessed-portion 21.

FIG. 21 illustrates a case where only the second recessed-portion 21 is disposed on the bending auxiliary layer 20 and a recessed-portion is not disposed on the support plate 30. For example, in the embodiments of the present disclosure, the second recessed-portion 21 may be disposed in the portion of the bending auxiliary layer 20 located in the first region A1. The second recessed-portion 21 may be located on the side of the bending auxiliary layer 20 facing toward the support plate 30, and the adhesive layer 40 may be filled in the second recessed-portion 21. That is, by forming the second recessed-portion 21 on the bending auxiliary layer 20, the sum of the thicknesses of the support plate 30 and the bending auxiliary layer 20 in the first region A1 may be less than the sum of the thicknesses of the support plate 30 and the bending auxiliary layer 20 in the second region A2. In the present disclosure, the adhesive layer 40 may be filled in the second recessed-portion 21, which may not only implement the fixing of the bending auxiliary layer 20 and the support plate 30 in the first region A1, but also reduce the spacing between the bending auxiliary layer 20 and the support plate 30 in the second region A. In such way, in the unbent state of the display device 100, the portion of the support plate 30 located in the second region A2 may support the bending auxiliary layer 20 and the flexible display panel 10, and a new support structure may not need to be introduced in the second region A2, thereby being beneficial for reducing the creases on the display device 100 and saving production costs.

Figure 22:
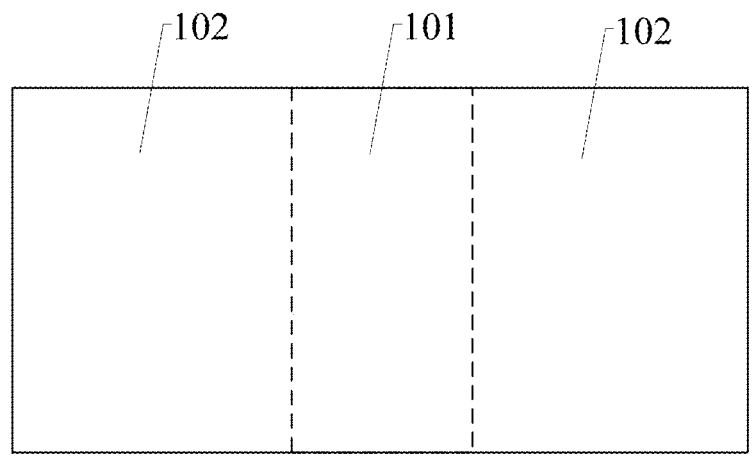
FIG. 22 illustrates a top view of a flexible display panel according to various embodiments of the present disclosure.

In optional embodiment of the present disclosure, FIG. 22 illustrates a top view of the flexible display panel 10 according to various embodiments of the present disclosure. The unbent state of the flexible display panel 10 may be illustrated in one embodiment. Referring to FIGS. 2, 3 and 22, the flexible display panel 10 may include a first bendable portion 101 and non-bendable portions 102 located on two opposite sides of the first bendable portion 101; the bending auxiliary layer 20 may extend from one of the non-bendable portions 102 to the other one of the non-bendable portions 102 through the first bendable portion 101. The display device 100 may include the bent state and the unbent state. In the bent state, the flexible display panel 10 may be located at the inner side of the bending auxiliary layer 20; and in the unbent state, the portion of the support plate 30 located in the first region A1 may overlap the non-bendable portion 102, and the portion of the support plate 30 located in the second region A2 may overlap the first bendable portion 101.

For example, referring to FIGS. 2, 3 and 22, the flexible display panel 10 may be disposed with the first bendable portion 101 and two non-bendable portions 102 located on two opposite sides of the first bendable portion 101. In the display device 100 provided by the present disclosure, the bending auxiliary layer 20 on one side of the flexible display panel 10 may extend from one non-bending portion 102 to the other non-bending portion 102 through the first bendable portion 101. When the display device 100 is bent, the first bendable portion 101 of the flexible display panel 10 may be bent with the assistance of the bending auxiliary layer 20, one non-bendable portion 102 may approach the other non-bendable portion 102. In the bent state, the entire flexible display panel 10 may be located at the inner side of the bending auxiliary layer 20 to fold the display device 100. Therefore, the display device 100 of the present disclosure may have a relatively large display area or a relatively small carrying size compared with a non-foldable display device, thereby being beneficial for bringing a desirable user experience. In the present disclosure, the portion of the support plate 30 located in the first region A1 may overlap the non-bendable portion 102 to support the portion of the flexible display panel 10 located in the first region A1, which may avoid creases or abnormal display caused by the folding of the non-bending portion 102 of the flexible display panel 10. In the unbent state, the portion of the support plate 30 located in the second region A2 may overlap the first bendable portion 101 of the flexible display panel 10 to support the first bendable portion 101. Therefore, the first bendable portion 101 may be supported without introducing an additional supporting structure into the display device 100, and the creases of the first bendable portion 101 in the unbent state may be avoided, which is beneficial for improving the display effect of the display device 100.

In an optional embodiment of the present disclosure, referring to FIG. 2, the sum of the thicknesses T1 (corresponding to h1+h6+h3) of the bending auxiliary layer 20, the adhesive layer 40 and the support plate 30 in the first region A1 and the sum of the thicknesses T2 (h2+h4) of the bending auxiliary layer 20 and the support plate 30 in the second region A2 may satisfy the following conditions: T1=T2+k1, where 0≤k1≤2 μm, and h6 denotes the thickness of the adhesive layer 40.

For example, in the display device 100 provided by the embodiments of the present disclosure, the difference between the sum of the thicknesses T1 of the bending auxiliary layer 20, the adhesive layer 40 and the support plate 30 in the first region A1 and the sum of the thicknesses T2 of the bending auxiliary layer 20 and the support plate 30 in the second region A2 is T1−T2=k1, where k1 denotes the height of the spacing between the support plate 30 and the bending auxiliary layer 20 in the second region A2. The height of the spacing may be configured to be greater than or equal to 0 in the present disclosure. That is, no spacing may be between the support plate 30 and the bending auxiliary layer 20 in the second region A2, and the support plate 30 may be in direct contact with the bending auxiliary layer 20 in the second region A2. In the unbent state, the support plate 30 may reliably support the portion of the bending auxiliary layer 20 in the second region A2, and further reliably support the portion of the flexible display panel 10 in the second region A2, which may effectively avoid the creases on the first bendable portion 101 of the flexible display panel 10, thereby being beneficial for improving the display effect of the display device 100 in the unbent state.

When the height of the spacing between the bending auxiliary layer 20 and the support plate 30 in the second region A2 is greater than 2 μm, visible creases may be likely to occur at the spacing between the bending auxiliary layer 20 and the support plate 30, which may affect the display effect. However, when the height of the spacing between the bending auxiliary layer 20 and the support plate 30 in the second region A2 is configured to be less than or equal to 2 μm in the present disclosure, the spacing between the bending auxiliary layer 20 and the support plate 30 may be relatively small. In the unbent state, only a relative displacement of ≤2 μm between the bending auxiliary layer 20 and the support plate 30 may be needed to achieve the contact, such that the portion of the support plate 30 located in the second region A2 may reliably support the bending auxiliary layer 20 and the flexible display panel 10, which is also beneficial for avoiding the creases in the first bendable portion 101 of the flexible display panel 10 and for improving the display effect of the display device 100 in the unbent state. Optionally, in the present disclosure, the height of the spacing between the bending auxiliary layer 20 and the support plate 30 (that is, above-mentioned k1) may be configured as 0, 0.2 μm, 0.5 μm, 0.7 μm, 0.9 μm, 1 μm, 1.2 μm, 1.5 μm, 1.8 μm, 2 μm, or the like.

Referring to FIGS. 2, 3 and 22, considering that the bending auxiliary layer 20 also has a certain rigidity and a certain supporting performance, in the first region A1, the bending auxiliary layer 20 and the support plate 30 may reliably support the non-bendable portion of the flexible display panel 10 simultaneously, which may effectively avoid the bending deformation of the non-bendable portion 102 of the flexible display panel 10. In the bent state, the portion of the bending auxiliary layer 20 located in the second region A2 may support the first bendable portion 101 of the flexible display panel 10 to a certain extent; the portion of the support plate 30 located in the second region A2 may better support the portion of the bending auxiliary layer 20 located in the second region A2, thereby reliably supporting the first bendable portion 101 of the flexible display panel 10 indirectly. Therefore, the creases in the first bendable portion 101 of the flexible display panel 10 may be avoided without introducing an additional supporting structure, which is beneficial for saving production costs and improving the display effect.

Figure 23:
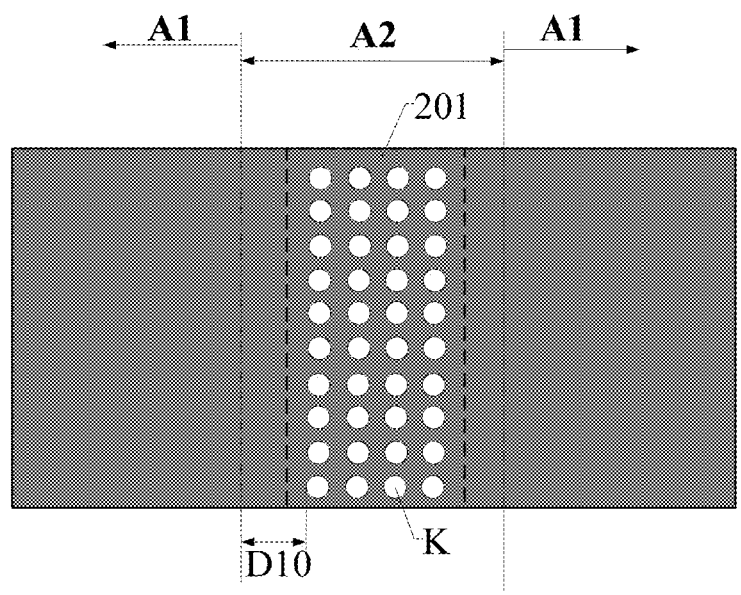
FIG. 23 illustrates a top view of a bending auxiliary layer according to various embodiments of the present disclosure.

In an optional embodiment of the present disclosure, FIG. 23 illustrates a top view of the bending auxiliary layer 20 according to various embodiments of the present disclosure. Referring to FIGS. 3 and 23, the bending auxiliary layer 20 may include a second bendable portion 201 which overlaps the first bendable portion 101; and the second bendable portion 201 may include a hollowed pattern K.

For example, referring to FIGS. 3 and 23, in the bent state, the bending portion of the bending auxiliary layer 20 may be the second bendable portion 201, and the second bendable portion 201 may overlap the first bendable portion 101 in the flexible display panel 10, that is, the portion of the bending auxiliary layer 20 that assists the bending of the flexible display panel 10 may be the second bendable portion 201. The second bending portion of the bending auxiliary layer 20 of the present disclosure may include the hollowed pattern K. The introduction of the hollowed pattern K may reduce the overall rigidity of the second bending portion of the bending auxiliary layer 20, such that the second bending portion may be easier to be bent, and the first bendable portion 101 of the flexible display panel 10 may be easier driven to bend. Therefore, the user may only need to use a small external force to implement the bending of the display device, which is more beneficial for improving the user experience.

It should be noted that the circular hollowed shape in the hollowed pattern K may be taken as an example for illustration in FIG. 23. In some other embodiments of the present disclosure, the hollowed shape may also be embodied in other shapes such as a square, an ellipse, and a triangle, which may not be limited according to various embodiments of the present disclosure.

In an optional embodiment of the present disclosure, referring to FIG. 23, the distance D10 between the region of the hollowed pattern K and the first region A1 may be greater than or equal to 0.2 mm.

For example, in the present disclosure, the hollowed pattern K may be disposed in a portion of the bending auxiliary layer 20 in the second region A2. A certain distance may be reserved between the hollowed pattern K and the first region A1, and the distance D10 between the region of the hollowed pattern K and the first region A1 may be greater than or equal to 0.2 mm. It is equivalent to introducing a transition region between the hollowed pattern K and the first region A1, and the width of the transition region may be greater than or equal to 0.2 mm. Since the portion of the bending auxiliary layer 20 where the hollowed pattern K is disposed is easier to be bent than the portion where the hollowed pattern K is not disposed, a partial region, adjacent to the first region A1, in the portion of the bending auxiliary layer 20 in the second region A2 may be at least reserved without disposing a hollowed portion in the present disclosure. In such way, during the bending process of the display device 100, the bending stress may be smoothly transitioned between the first region A1 and the second region A2, which may avoid a sudden stress changes between the first region A1 and the second region A2. Furthermore, a portion of the transition region may be reserved between the hollowed pattern K and the first region A1; even if the alignment deviation is caused by the process and the like, the transition region may be effectively compatible with the alignment deviation, which may effectively avoid the deviation of the bendable region of the bending auxiliary layer 20.

In an optional embodiment of the present disclosure, referring to FIG. 21, the number of the support plates 30 may be two, and the two support plates 30 may overlap the two non-bendable portions 102, respectively. In the unbent state, a distance D20 between the two support plates 30 may be greater than zero.

For example, referring to FIGS. 21 and 22, when the flexible display panel 10 includes one second bendable portion 201 and two non-bendable portions 102, the number of corresponding support plates 30 may be two, and the two support plates 30 may overlap the two non-bending portions 102, respectively. In the unbent state, a spacing may be between the two support plates 30, and the width D20 of the spacing may be configured to be between about 0.1 mm and about 0.3 mm (including end points), for example, 0.15 mm, 0.2 mm, 0.25 mm, or the like. In such way, it is beneficial for avoiding the interference between the two support plates 30 from the bent state to the unbent state which may affect the unbending process of the display device 100.

Figure 24:
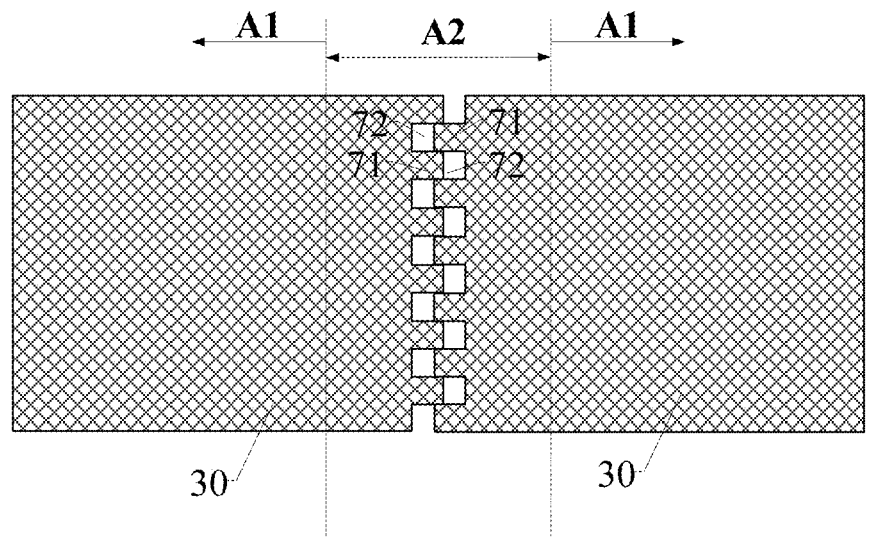
FIG. 24 illustrates a top structural view of a display panel with two support plates according to various embodiments of the present disclosure.

In an optional embodiment of the present disclosure, FIG. 24 illustrates a top structural view of the display device2 100 with two support plates 30 according to various embodiments of the present disclosure. The number of the support plates 30 may be two, and the support plates 30 may respectively overlap the two non-bendable portions. In the unbent state, the two opposite sides of the two support plates 30 may each include a plurality of protruding portions 71 and a plurality of recessed-portions 72; and the protruding portion 71 on one of the two support plates 30 may be engaged with the recessed-portion 72 on the other support plate 30.

For example, referring to FIGS. 21, 23, and 24, when the flexible display panel 10 includes one second bendable portion 201 and two non-bendable portions 102, the number of corresponding support plates 30 may be two, and the two support plates 30 may overlap the two non-bendable portions, respectively. In the unbent state, the plurality of protruding portions 71 may be disposed on the side of one support plate 30 facing toward the other support plate 30, and the plurality of protruding portions 71 may be disposed on the side of the other support plate 30, where the protruding portion 71 on one support plate 30 may be engaged with the recessed-portion 72 on the other support plate 30. In such way, in the unbent state, the two support plates 30 may be seamlessly connected to form a flat surface, which may be more beneficial for implementing reliable support for the bending auxiliary portion and the flexible display panel 10 and avoiding the creases on the flexible display panel 10.

It should be understood that the squared protruding portions 71 and the squared recessed-portions 72 on the support plate 30 may be taken as an example for illustration in FIG. 24. In some other embodiments of the present disclosure, the protruding portions 71 and the recessed-portions 72 on the support plate 30 may also be embodied in arc structures, sawtooth structures, and the like, which may not be limited according to various embodiments of the present disclosure.

Figure 25:
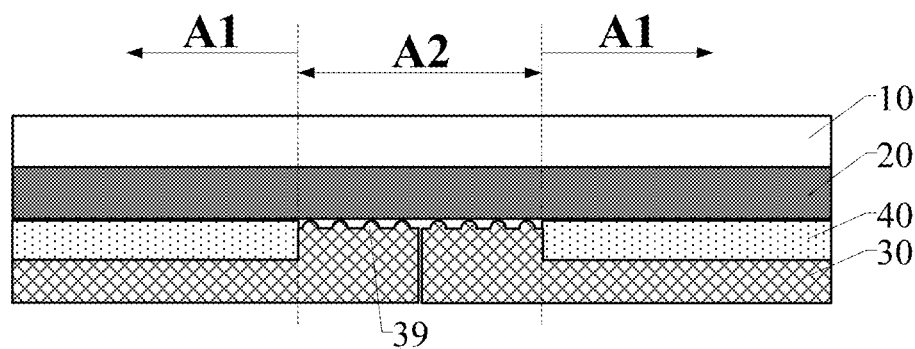
FIG. 25 illustrates another schematic showing a relative positional relationship between a support plate and a bending auxiliary layer according to various embodiments of the present disclosure.

In an optional embodiment of the present disclosure, FIG. 25 illustrates another schematic showing a relative positional relationship between the support plate 30 and the bending auxiliary layer 20 according to various embodiments of the present disclosure. The portion of the support plate 30 located in the second region A2 may be a flat part, and the surface of the flat part adjacent to the second bendable portion 201 may include a plurality of micro protruding portions 39.

For example, in the second region A2, the plurality of micro protruding portions 39 may be disposed on the surface of the support plate 30 facing toward the second bendable portion 201 of the bending auxiliary portion in the present disclosure. Optionally, the micro protruding portions 39 may be evenly arranged in the second region A2. In the unbent state, in the second region A2, the micro protruding portions 39 on the support plate 30 may be in direct contact with the bending auxiliary layer 20 to provide multi-point support for the bending auxiliary layer 20, thereby realizing reliable support for the flexible display panel 10, which may also be beneficial for improving the supporting reliability and avoiding the creases of the flexible display panel 10 in the unbent state.

Figure 26:
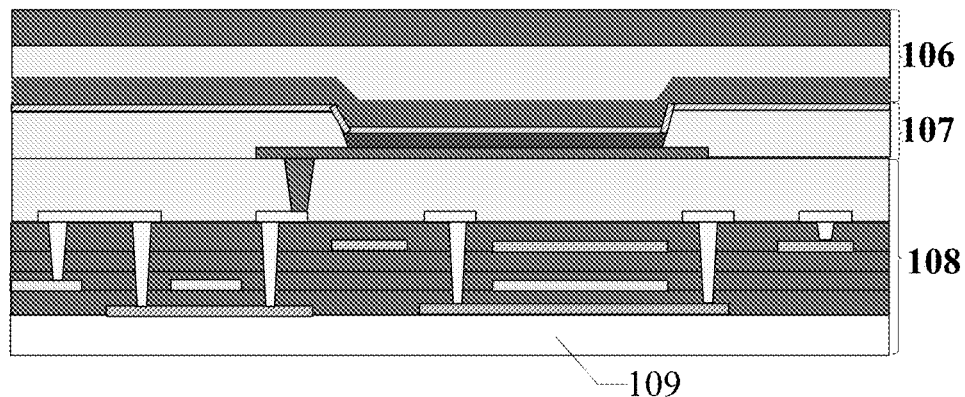
FIG. 26 illustrates a structural schematic of a flexible display panel according to various embodiments of the present disclosure.

In an optional embodiment of the present disclosure, FIG. 26 illustrates a structural schematic of the flexible display panel 10 according to various embodiments of the present disclosure. The flexible display panel 10 may include a substrate 109, a drive circuit layer 108, a light-emitting element 107, and an encapsulation layer 106 that are stacked with each other. The drive circuit layer 108 and the light-emitting element 107 may be located between the substrate 109 and the encapsulation layer 106; and the first surface S1 of the flexible display panel 10 may be a surface of the substrate 109 away from the encapsulation layer 106.

For example, FIG. 26 illustrates a structure of the flexible display panel 10 in the present disclosure. The flexible display panel 10 may include the substrate 109, the drive circuit layer 108, the light-emitting element 107, and the encapsulation layer 106. The drive circuit layer 108 may be disposed with a plurality of transistors for driving the light-emitting element 107 to emit light. The light-emitting element 107 may include, for example, an organic light-emitting material, or may be embodied as a Mini LED or a Micro LED, and the like. The light-emitting element 107 as an organic light-emitting element may be taken as an example for illustration in FIG. 26, which may not be limited according to various embodiments of the present disclosure. The encapsulation layer 106 may be used to encapsulate the light-emitting element 107 to prevent external moisture or oxygen from affecting the light-emitting element 107.

Figure 27:
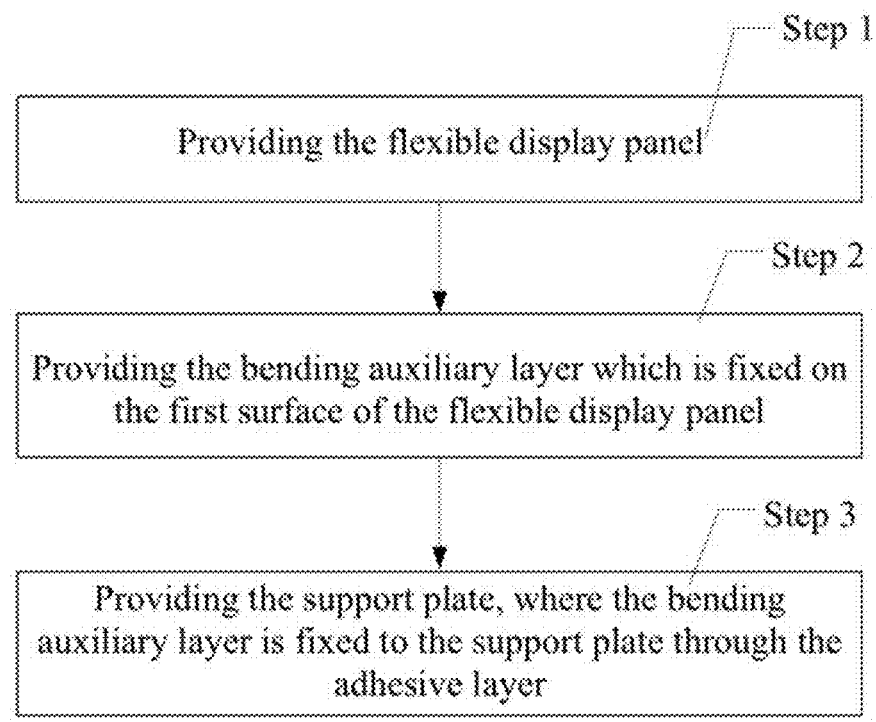
FIG. 27 illustrates a flowchart of a method for forming a display device according to various embodiments of the present disclosure.

Based on the same inventive concept, FIG. 27 illustrates a flowchart of a method for forming the display device 100 according to various embodiments of the present disclosure. The present disclosure also provides a forming method of the display device 100, which is suitable for the display device 100 provided by the present disclosure. Referring to FIGS. 2, 3, and 27, the formation method may include:

step 1, providing the flexible display panel 10;

step 2, providing the bending auxiliary layer 20 which is fixed on the first surface 11 of the flexible display panel 10; and step 3, providing the support plate 30, where the bending auxiliary layer 20 is fixed to the support plate 30 through the adhesive layer 40.

A thinning process or a thickening process may be performed on the bending auxiliary layer 20 to form the recessed-portion; or a thinning process or a thickening process may be performed on the support plate 30 to form the recessed-portion; and the adhesive layer 40 may at least be filled in the recessed-portions.

For example, referring to FIGS. 2, 3, and 27, in the process of forming the display device 100 provided by the present disclosure, the bending auxiliary layer 20 may be fixed on the first surface 11 of the flexible display panel 10 to assist the flexible display panel 10 to be bent; then, the support plate 30 may be fixed on the bending auxiliary layer 20 away from the flexible display panel 10, and the support plate 30 and the bending auxiliary layer 20 may be adhered by the adhesive layer 40. In particular, the recessed-portions may be formed on the side of the bending auxiliary layer 20 facing toward the support plate 30 and/or the side of the support plate 30 facing toward the bending auxiliary layer 20. The recessed-portions may be formed by a thinning process or a thickening process, and the adhesive layer 40 may be filled in the recessed-portions. It should be noted that the thinning process may be used to remove a partial structure on the originally complete bending auxiliary layer 20 or the support plate 30; and the thickening process may be to add a partial structure to the original complete bending auxiliary layer 20 or support plate 30. In the present disclosure, the recessed-portions may be formed on the bending auxiliary layer 20 or the support plate 30, such that the sum of the thicknesses of the bending auxiliary layer 20 and the support plate 30 in the first region A1 (i.e., the region disposing the recessed-portions) may be less than the sum of the thicknesses of the bending auxiliary layer 20 and the support plate 30 in the second region A2 (i.e., the region without disposing the recessed-portions). The adhesive layer 40 may be filled in the recessed-portions and may not be disposed in the second region A2, and the portion of the support plate 30 located in the first region A1 may support the bending auxiliary layer 20 and the flexible display panel 10 at the first region A1. In the unbent state, since the step difference between the bending auxiliary layer 20 and the support plate 30 in the first region A1 is compensated by the adhesive layer 40, the spacing between the support plate 30 and the bending auxiliary layer 20 in the second region A2 may be greatly reduced. Therefore, the portion of the support plate 30 located in the second region A2 may provide a flattened support surface for the bending auxiliary layer 20 and the flexible display panel 10 in the unbent state of the display device 100. Such formation method may not need to introduce a new film structure in the display device 100, which may be beneficial for reducing the possibility of creases in the second region A2 of the display device 100 in the unbent state and also for saving production costs.

Furthermore, the sum of the thicknesses of the bending auxiliary layer 20 and the support plate 30 in the first region A1 is less than the sum of the thicknesses of the bending auxiliary layer 20 and the support plate 30 in the second region A2, and the adhesive layer 40 is filled between the bending auxiliary layer 20 and the support plate 30 with the smaller sum of thicknesses of the bending auxiliary layer 20 and the support plate 30. Therefore, the thickness of the adhesive layer 40 that can be filled between the bending auxiliary layer 20 and the support plate 30 may be relatively large; and the thickness of the adhesive layer 40 may be greater than or equal to the difference between the sum of the thicknesses of the bending auxiliary layer 20 and the support plate 30 in the second region A2 and the sum of the thicknesses of the bending auxiliary layer 20 and the support plate 30 in the first region A1. When the thickness of the adhesive layer is relatively small, for example, the thickness of the adhesive layer is equivalent to or slightly larger than the size of a particle, the adhesive layer may not completely cover the particle, and air bubbles may be easily generated at the position of the adhesive layer. In the present disclosure, the thickness of the adhesive layer 40 may be relatively large, and the adhesive layer 40 may easily cover the particles on the surfaces of the support plate 30 and the bending auxiliary layer 20 which are in direct contact with the adhesive layer 40 or may easily cover the uneven surfaces (e.g., slightly concave or convex surfaces) of the support plate 30 and the bending auxiliary layer 20 which are in direct contact with the adhesive layer 40. Therefore, air bubbles may not be easily generated between the adhesive layer 40 and the support plate 30 and between the adhesive layer 40 and the bending auxiliary layer 20, which may be beneficial for improving the adhesive effect between the adhesive layer 40 and each of the support plate 30 and the bending auxiliary layer 20, reducing the film separation between the bending auxiliary layer 20 and the support plate 30 under the action of the bending stress, thereby being more beneficial for improving the fixing reliability between the bending auxiliary layer 20 and the support plate 30.

In an optional embodiment of the present disclosure, when the bending auxiliary layer or the support plate is formed by a thinning process, the thinning process may include a chemical etching process.

When the bending auxiliary layer or the support plate is formed by a thickening process, the thickening process may include at least one of an electroplating process, a press soldering process, and a bending process.

For example, when a chemical etching process is used to form recessed-portions on the bending auxiliary layer or the support plate, the dimensional precision of the recessed-portions formed on the bending auxiliary layer or the support plate may be better controlled. Such method may be especially suitable for the case where the thickness of the bending auxiliary layer or the support plate is relatively large, and the precision of the chemical etching process may be relatively high. When the thickness of the bending auxiliary layer or the support plate is relatively small, the supporting performance may be greatly affected if the thickness is further reduced. Therefore, a thickening process also be introduced for the bending auxiliary layer or the support plate with a relatively small thickness in the present disclosure, and a partial structure may be added to the bending auxiliary layer or the support plate with a relatively small thickness. For example, a partial structure may be added to the bending auxiliary layer or the support plate using any one of the electroplating process, the press soldering process, or the bending process, which may also be beneficial for improving the supporting reliability of the bending auxiliary layer and the support plate while forming the recessed-portions.

From the above-mentioned embodiments, it can be seen that the display device and its formation method provided by the present disclosure may achieve at least the following beneficial effects.

For the display panel and its formation method provided by the embodiments of the present disclosure, the bending auxiliary layer and the support plate may be introduced, such that the flexible display panel may be bent while supporting the flexible display panel with the support plate. The region where the bending auxiliary layer and the support plate are overlapped with each other may include the first region and the second region. The sum of the thicknesses of the bending auxiliary layer and the support plate in the first region may be less than the sum of the thicknesses of the bending auxiliary layer and the support plate in the second region; the adhesive layer for fixing the bending auxiliary layer to the support plate may be in the first region where the sum of the thicknesses of the bending auxiliary layer and the support plate is small; and the adhesive layer may not be disposed in the second region. When the display device is bent, that is, in the bent state, the bending region may be in the second region where the adhesive layer is not disposed, and the portion of the support plate in the first region may support the flexible display panel in the first region. In the unbent state, since the step difference between the bending auxiliary layer and the support plate in the first region is compensated by the adhesive layer, the spacing between the support plate and the bending auxiliary layer in the second region may be greatly reduced. Therefore, the support plate in the second region may provide a flattened support surface for the bending auxiliary layer and the flexible display panel. A new film structure may not need to be introduced to reduce the possibility of creases in the second region of the display device in the unbent state.

Furthermore, the sum of the thicknesses of the bending auxiliary layer and the support plate in the first region is less than the sum of the thicknesses of the bending auxiliary layer and the support plate in the second region, and the adhesive layer is filled between the bending auxiliary layer and the support plate with a smaller sum of the thicknesses of the bending auxiliary layer and the support plate. Therefore, the thickness of the adhesive layer that can be filled between the bending auxiliary layer and the support plate may be relatively large. The greater the thickness of the adhesive layer is, the less likely the bubbles are generated, which may be more beneficial for reducing the film separation between the bending auxiliary layer and the support plate and improving the fixing reliability between the bending auxiliary layer and the support plate.

It should be noted that the above may only be the preferred embodiments of the present disclosure and the applied technical principles. Those skilled in the art should understand that the present disclosure is not limited to the embodiments described herein. For those skilled in the art, various obvious changes, readjustments and substitutions may be made without departing from the protection scope of the present disclosure. Therefore, although the present disclosure has been described in more detail through the above-mentioned embodiments, the present disclosure may not be limited to the above-mentioned embodiments. Without departing from the concept of the present disclosure, more other equivalent embodiments may be included, and the scope of the present disclosure may be determined by the scope of the appended claims.

What is claimed is:

1. A display device, comprising:
   a flexible display panel;
   a bending auxiliary layer, fixed on a first surface of the flexible display panel;
   a support plate, at a side of the bending auxiliary layer away from the flexible display panel, the support plate including a base and a protruding portion, wherein the protruding portion is at a side of the base facing toward the bending auxiliary layer and connected to the base; and
   an adhesive layer, between the bending auxiliary layer and the support plate, configured to fix the bending auxiliary layer to the support plate, wherein:
   a region wherein the bending auxiliary layer and the support plate are overlapped with each other includes a first region and a second region, the protruding portion of the support plate is at the second region, and a remaining portion of the base uncovered by the protruding portion is at the first region;
   a sum of thicknesses of the bending auxiliary layer and the support plate in the first region is less than a sum of thicknesses of the bending auxiliary layer and the support plate in the second region; and
   the adhesive layer is in the first region and not in the second region.

2. The display device according to claim 1, wherein:
   the bending auxiliary layer is made of a material including an alloy.

3. The display device according to claim 1, wherein:
   the support plate includes a first recessed-portion in the first region; and
   at least a portion of the adhesive layer is filled in the first recessed-portion.

4. The display device according to claim 3, wherein:
a ratio R0 of a thickness of the first recessed-portion over a thickness of the support plate in the second region satisfies $\frac{1}{4} \leq R0 \leq \frac{3}{4}$.

5. The display device according to claim 3, wherein:
the support plate includes a retaining wall surrounding the first recessed-portion.

6. The display device according to claim 3, wherein:
the first recessed-portion includes a first sub-recessed-portion and a second sub-recessed-portion which are connected to each other, and the second sub-recessed-portion is at a side of the first sub-recessed-portion adjacent to the second region; and
the first sub-recessed-portion includes a first surface facing toward the adhesive layer; the second sub-recessed-portion includes a second surface facing toward the adhesive layer; and a distance between the second surface of the second sub-recessed-portion and the bending auxiliary layer is less than a distance between the first surface of the first sub-recessed-portion and the bending auxiliary layer.

7. The display device according to claim 6, further including:
a plurality of second sub-recessed-portions, wherein:
the first sub-recessed-portion and a structure including the plurality of second sub-recessed-portions are arranged along a first direction, and the plurality of second sub-recessed-portions are arranged along a second direction, wherein the first direction intersects the second direction.

8. The display device according to claim 3, wherein:
the support plate further includes a reinforcing pattern at the first recessed-portion; the first recessed-portion includes a third surface facing toward the adhesive layer; the reinforcing pattern is directly connected to the third surface; and a distance between the reinforcing pattern and the bending auxiliary layer is less than a distance between the third surface and the bending auxiliary layer.

9. The display device according to claim 8, wherein:
the reinforcing pattern includes a plurality of reinforcing sub-patterns discretely disposed at the first recessed-portion; or
the reinforcing pattern is a mesh structure; or
the reinforcing pattern includes a plurality of reinforcing strips which extends along a third direction and is arranged along a fourth direction.

10. The display device according to claim 8, wherein:
a height of the reinforcing pattern is equal to a depth of the first recessed-portion; or a height of the reinforcing pattern is less than a depth of the first recessed-portion.

11. The display device according to claim 3, wherein:
the bending auxiliary layer includes a second recessed-portion in the first region; along a fifth direction, the first recessed-portion of the support plate overlaps the second recessed-portion of the bending auxiliary layer; and the fifth direction is a direction perpendicular to a plane of the support plate; and
at least a portion of the adhesive layer is filled in the second recessed-portion.

12. The display device according to claim 1, wherein:
the bending auxiliary layer includes a second recessed-portion, and the adhesive layer is filled in the second recessed-portion.

13. A display device, comprising:
a flexible display panel;
a bending auxiliary layer, fixed on a first surface of the flexible display panel;
a support plate, at a side of the bending auxiliary layer away from the flexible display panel; and
an adhesive layer, between the bending auxiliary layer and the support plate, configured to fix the bending auxiliary layer to the support plate, wherein:
a region wherein the bending auxiliary layer and the support plate are overlapped with each other includes a first region and a second region;
a sum of thicknesses of the bending auxiliary layer and the support plate in the first region is less than a sum of thicknesses of the bending auxiliary layer and the support plate in the second region;
the adhesive layer is in the first region and not in the second region;
the flexible display panel includes a first bendable portion and non-bendable portions at two opposite sides of the first bendable portion;
the bending auxiliary layer extends from one of the non-bendable portions to the other one of the non-bendable portions through the first bendable portion; and
the display device includes a bent state and an unbent state, wherein in the bent state, the flexible display panel is at an inner side of the bending auxiliary layer; and in the unbent state, a portion of the support plate in the first region overlaps the non-bendable portions, and a portion of the support plate in the second region overlaps the first bendable portion.

14. The display device according to claim 13, wherein:
a sum of thicknesses of the bending auxiliary layer, the adhesive layer, and the support plate in the first region and the sum of the thicknesses of the bending auxiliary layer and the support plate in the second region satisfies: $T1=T2+k1$, wherein $0 \leq k1 \leq 2$ μm.

15. The display device according to claim 13, wherein:
the bending auxiliary layer includes a second bendable portion; and
the second bendable portion overlaps the first bendable portion and includes a hollowed pattern.

16. The display device according to claim 13, wherein:
a quantity of support plates is two, and the two support plates overlap two non-bendable portions, respectively; and in the unbent state, a distance between the two support plates is greater than zero; or
a quantity of support plates is two, and the two support plates overlap two non-bendable portions, respectively; and each of two opposite sides of the two support plates includes a plurality of protruding portions and a plurality of recessed-portions, and in the unbent state, a protruding portion on one of the two support plates is engaged with a recessed-portion on the other one of the two support plates.

17. The display device according to claim 13, wherein:
the portion of the support plate in the second region includes a flat part, and a surface of the flat part adjacent to the second bendable portion includes a plurality of micro protruding portions.

* * * * *